US012598931B2

(12) United States Patent
Tsai

(10) Patent No.: US 12,598,931 B2
(45) Date of Patent: Apr. 7, 2026

(54) SEMICONDUCTOR STRUCTURE AND METHOD FOR FORMING THE SAME

(71) Applicant: Winbond Electronics Corp., Taichung (TW)

(72) Inventor: Wen-Chieh Tsai, Taichung (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 522 days.

(21) Appl. No.: 18/176,257

(22) Filed: Feb. 28, 2023

(65) Prior Publication Data

US 2023/0282487 A1 Sep. 7, 2023

(30) Foreign Application Priority Data

Mar. 2, 2022 (TW) ................................. 111107467

(51) Int. Cl.
*H01L 21/308* (2006.01)
*H01L 21/762* (2006.01)
*H10D 84/00* (2025.01)

(52) U.S. Cl.
CPC ...... *H01L 21/308* (2013.01); *H01L 21/76224* (2013.01); *H10D 84/00* (2025.01)

(58) Field of Classification Search
CPC ............. H01L 21/308; H01L 21/76224; H01L 21/3086; H01L 21/76229; H10D 84/00; H10D 30/0243; H10D 84/0193; H10D 84/038

See application file for complete search history.

(56) References Cited

U.S. PATENT DOCUMENTS

| | | | | |
|---|---|---|---|---|
| 11,715,640 B2 * | 8/2023 | Tung | ................... | H01L 21/0337 |
| | | | | 438/694 |
| 2010/0176479 A1 * | 7/2010 | Postnikov | ................. | G03F 7/40 |
| | | | | 257/E21.546 |
| 2011/0248382 A1 * | 10/2011 | Pellizzer | .............. | H10D 64/231 |
| | | | | 257/539 |
| 2013/0221443 A1 * | 8/2013 | Lin | ...................... | H10D 84/038 |
| | | | | 257/E27.06 |
| 2013/0309838 A1 * | 11/2013 | Wei | ................... | H01L 21/76229 |
| | | | | 257/E21.546 |
| 2014/0227879 A1 * | 8/2014 | Hwang | ................ | H10D 30/024 |
| | | | | 438/703 |
| 2015/0206788 A1 * | 7/2015 | Wang | .................. | H01L 21/3088 |
| | | | | 438/424 |

(Continued)

*Primary Examiner* — Sonya McCall-Shepard
(74) *Attorney, Agent, or Firm* — MUNCY, GEISSLER, OLDS & LOWE, P.C.

(57) ABSTRACT

A semiconductor structure and a method for forming the same are provided. The semiconductor structure includes a semiconductor substrate. The semiconductor substrate includes a base portion, a semiconductor bar portion on a first active area of the base portion, a set of semiconductor branch portions extending from a sidewall of the semiconductor bar portion to a second active area of the base portion, and first and second isolation structures formed on the second active area of the base portion. The first interface between the first isolation structure and the semiconductor bar portion is flat. The second interface between the second isolation structure and the semiconductor bar portion is flat. The first interface and the second interface are staggered from each other along the extending direction of the semiconductor bar portion.

8 Claims, 19 Drawing Sheets

(56)         References Cited

U.S. PATENT DOCUMENTS

| | | | |
|---|---|---|---|
| 2016/0163532 A1* | 6/2016 | Lu ...................... | H10D 30/6219 |
| | | | 438/695 |
| 2017/0077094 A1* | 3/2017 | Tsao .................... | H10D 84/151 |
| 2017/0200616 A1* | 7/2017 | Min .................... | H01L 21/3086 |
| 2018/0190538 A1* | 7/2018 | Chu .................... | H01L 21/3086 |
| 2019/0067008 A1* | 2/2019 | Chen .................... | H01L 23/481 |
| 2020/0126978 A1* | 4/2020 | Wang ................. | H10D 84/0135 |
| 2020/0234966 A1* | 7/2020 | Chang ................. | H01L 21/3086 |

* cited by examiner

A                                                                A'

A                                                                A'

B                                               B'

B                                               B'

B                                    B'

B                                    B'

C                               C'

C                               C'

SEMICONDUCTOR STRUCTURE AND METHOD FOR FORMING THE SAME

CROSS REFERENCE TO RELATED APPLICATIONS

This application claims priority of Taiwan Patent Application No. 111107467 filed on Mar. 2, 2022, and entitled "SEMICONDUCTOR STRUCTURE AND METHOD FOR FORMING THE SAME", the entirety of which is incorporated by reference herein.

BACKGROUND OF THE INVENTION

Field of the Invention

The invention relates to semiconductor technology, and in particular to a semiconductor structure for a memory device and a method for forming the same.

Description of the Related Art

As the demand for miniaturization increases, improving the density of semiconductor devices has become an important issue. In the process of semiconductor structure fabrication, a spacer self-aligned double patterning (SADP) process can be used to reduce the critical dimension (CD) of semiconductor devices, thereby increasing the integration of semiconductor structures. The conventional SADP process typically includes: forming a pattern composed of multiple sacrificial mandrels; forming a spacer layer on sidewalls of each sacrificial mandrel; removing the sacrificial mandrels to leave a pattern formed by the spacer layers; and defining the underlying layers using the pattern formed by the spacer layers.

In the manufacture of semiconductor memory devices (e.g., flash memory), the SADP process is used to form small-sized features, such as active areas, word lines, selection gates, and so on. For example, in the active area, a semiconductor bar portion and parallel-arranged semiconductor branch portions connected to the semiconductor bar portion are typically formed, and the region where the semiconductor branch portions are arranged is referred to as the array active region.

However, with the miniaturization of semiconductor devices, necking phenomenon may occur due to the reduction of linewidth and line spacing of the semiconductor branch portions. This can lead to CD variations and/or fractures, and the interface between the end of the isolation structure and the semiconductor bar portion may become curved and expanded, resulting in reduced yield and reliability.

Therefore, it is necessary to seek a novel method of manufacturing semiconductor structures that can solve or improve the above problems.

BRIEF SUMMARY OF THE INVENTION

Embodiments of the present disclosure provide a semiconductor structure and its manufacturing method, which can eliminate or reduce the necking phenomenon of adjacent semiconductor branch portions in the SADP process, and the problem of the curved and expanded interfaces between the isolation structure and the semiconductor bar portions.

In some embodiments, a semiconductor structure includes a semiconductor substrate. The semiconductor substrate includes a base portion, a semiconductor bar portion, a first set of semiconductor branch portions, and a first set of isolation structures. The base section includes a first active area and a second active area adjacent to the first active area. The semiconductor bar portion is located over the base portion corresponding to the first active area. The first set of semiconductor branch portions includes a plurality of first semiconductor branch portions extending from a first sidewall of the semiconductor bar portion onto the base portion corresponding to the second active area, and an extending direction of each of the first semiconductor branch portions different from an extending direction of the semiconductor bar portion The first isolation structure includes a first isolation structure and a second isolation structure. The first set of isolation structures is formed over the base portion corresponding to the second active area. The first isolation structure and the second isolation structure are formed between different adjacent semiconductor branch portions in the first set of semiconductor branch portions. The first isolation structure and the second isolation structure are alternately arranged along the extending direction of the semiconductor bar portion. A first interface between the first isolation structure and the semiconductor bar portion and a second interface between the second isolation structure and the semiconductor bar portion are flat. The first interface and the second interface are staggered from each other along the extending direction of the semiconductor bar portion.

In some embodiments, a method for forming a semiconductor structure includes successively forming a first mask layer, a sacrificial material layer and a first pattern over a semiconductor substrate, wherein the semiconductor substrate comprises a first active area between a second active area and a third active area. The semiconductor substrate includes a first active area between a second active area and a third active area. The first pattern includes a bar portion in the first active area and extending along a first direction. The first pattern also includes first set of branch portions and a second set of branch portions in the second active area and the third active area, respectively, and extending along a second direction that is different from the first direction The first set of branch portions is separated from a first sidewall of the bar portion by a distance. The second set of branch portions is separated from a second sidewall of the bar portion by the same distance. The distance is less than a space between two adjacent branch portions in the first set of branch portions. The method also includes transferring the first pattern to the sacrificial material layer to form a second pattern in the sacrificial material layer, removing the first pattern, and forming a spacer layer over the first mask layer to surround a bar portion, a first set of branch portions and a second set of branch portions in the second pattern. The method further includes removing the sacrificial material layer to form an opening pattern in the spacer layer, patterning the first mask layer using the spacer layer as an etch mask, and patterning the semiconductor substrate using the patterned first mask layer as an etch mask.

According to some embodiments, the distance between each of the first set of branch portions (or the second set of branch portions) and the bar portion in the first pattern is less than the space between two adjacent branch portions of the first set of branch portions (or the second set of branch portions). Therefore, semiconductor bar portions with different widths can be formed after the subsequent patterning of the semiconductor substrate. As a result, the interfaces between the adjacent isolation structures and the semiconductor bar portion are staggered from each other, and the interface between the isolation structure and the semiconductor bar portion is flat. Therefore, the necking phenomenon of the adjacent semiconductor branch portions during the SADP process can be eliminated or mitigated. As a result, the semiconductor branch portions can be prevented from fracturing and/or having CD variations. When the semiconductor structure of the present disclosure is used for memory devices, it enables the memory devices to have stable operating currents and improved yields and reliability.

BRIEF DESCRIPTION OF THE DRAWINGS

FIG. 1I-1 is a top view of a semiconductor structure according to another embodiment of the present disclosure.

DETAILED DESCRIPTION OF THE INVENTION

Figures 1A, 1B:
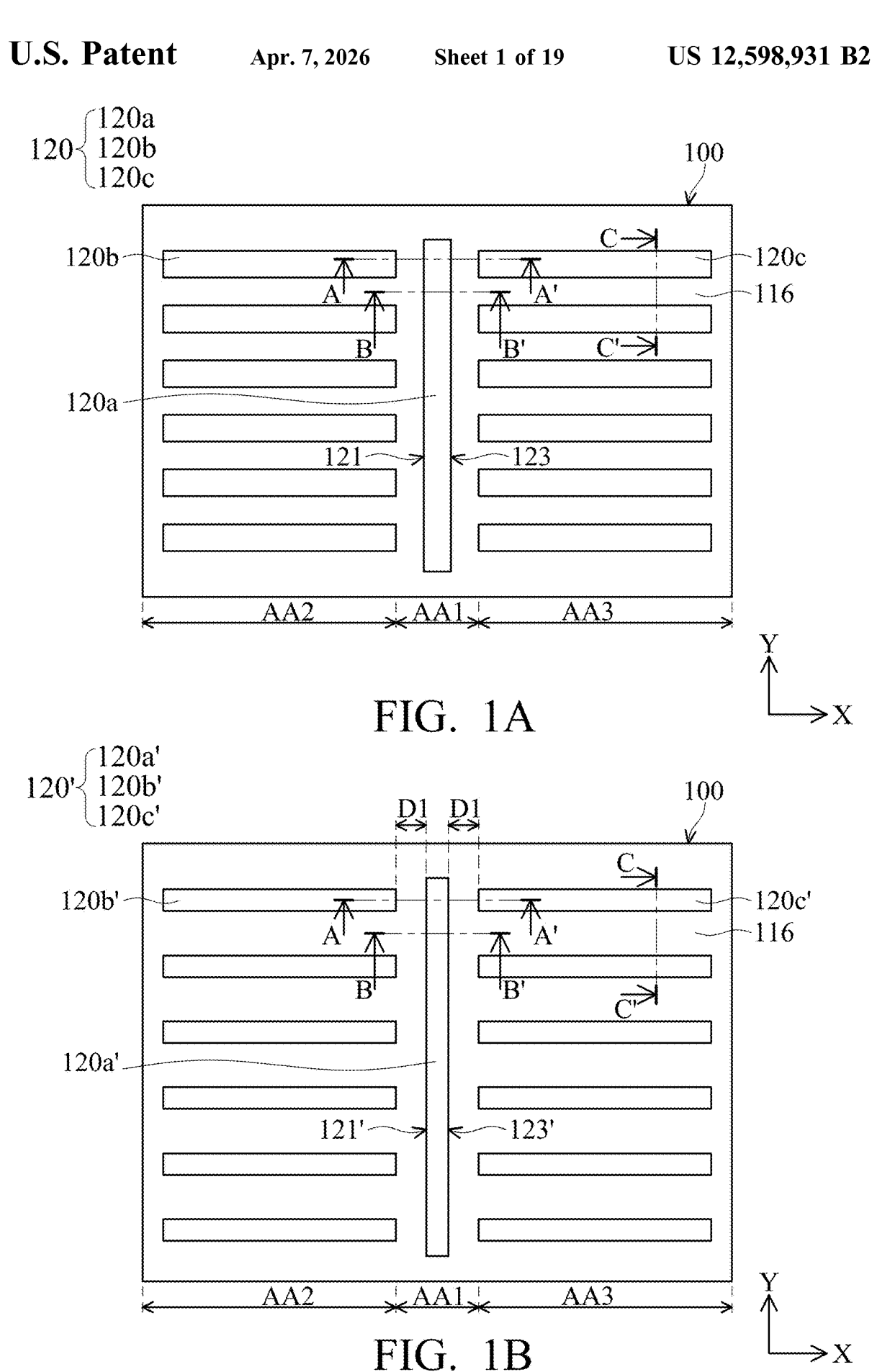
FIGS. 1A to 1I are top views of various steps of forming a semiconductor structure according to one embodiment of the present disclosure.
Figure 1C:
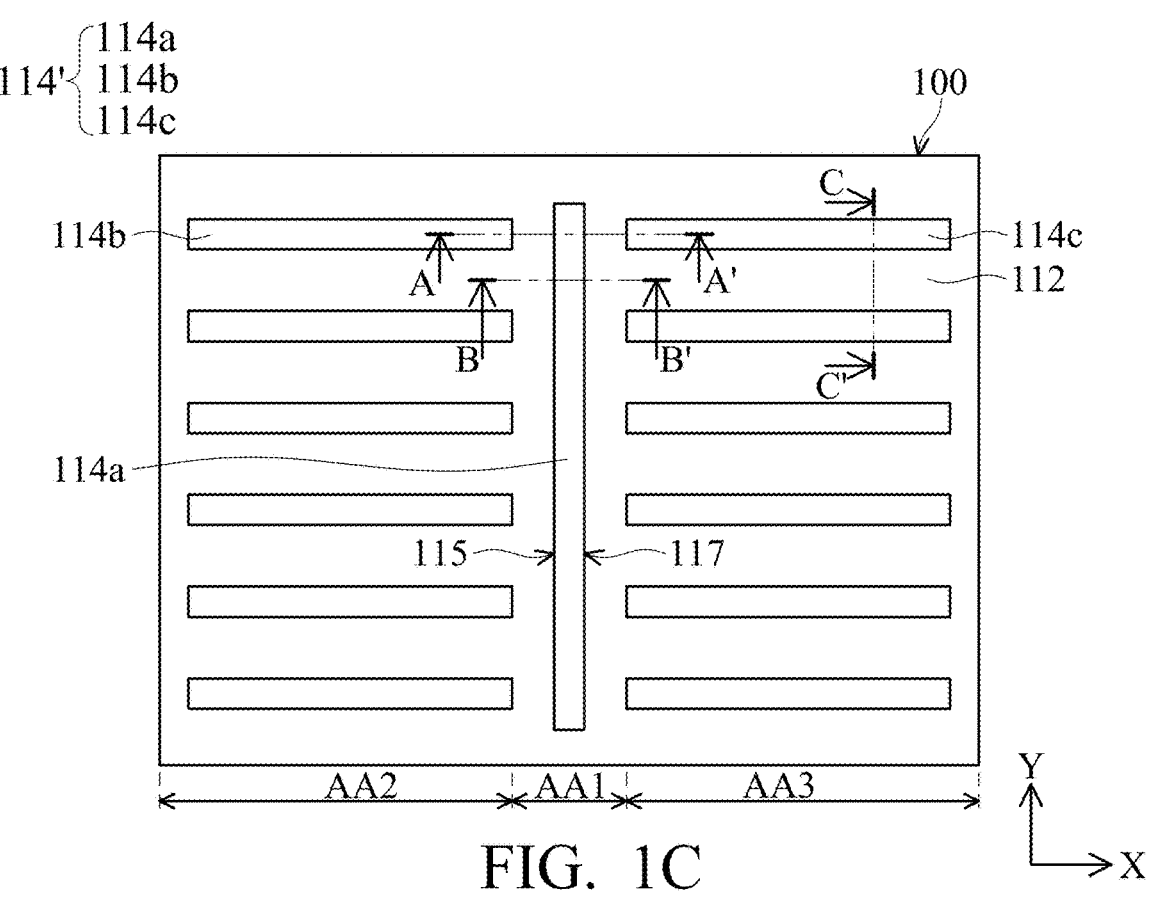
Figure 1D:
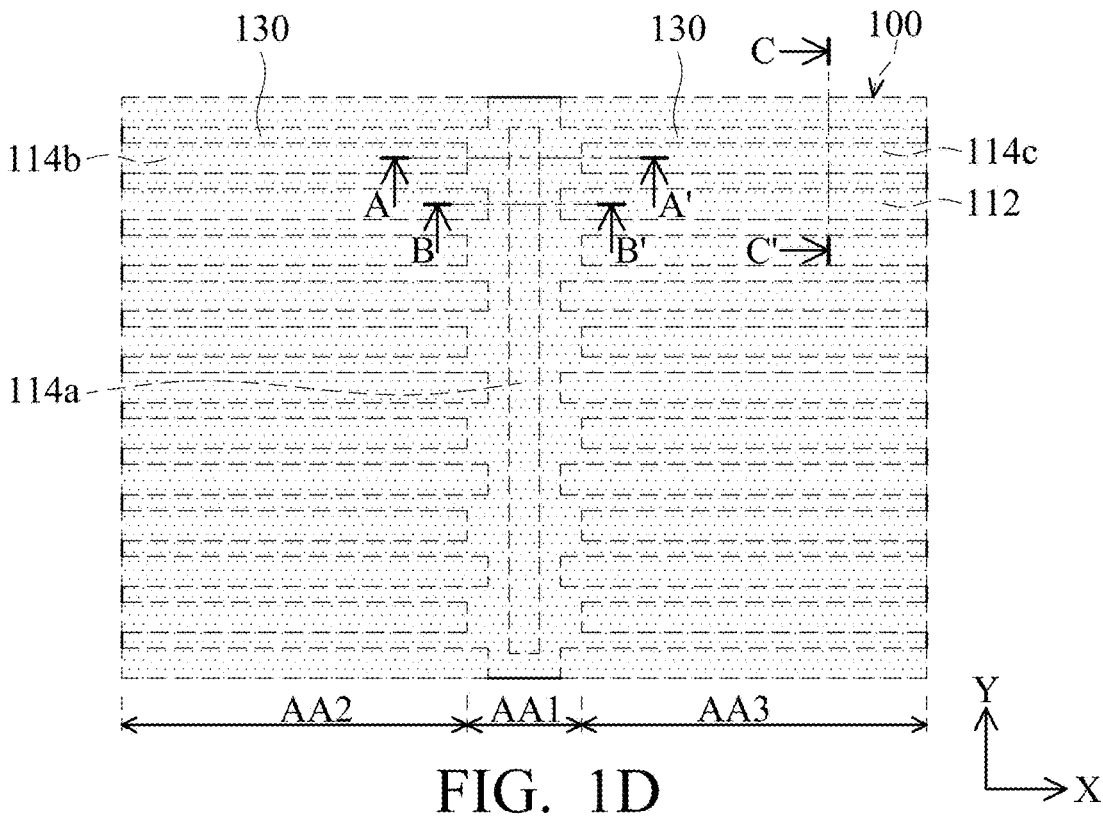
Figure 1E:
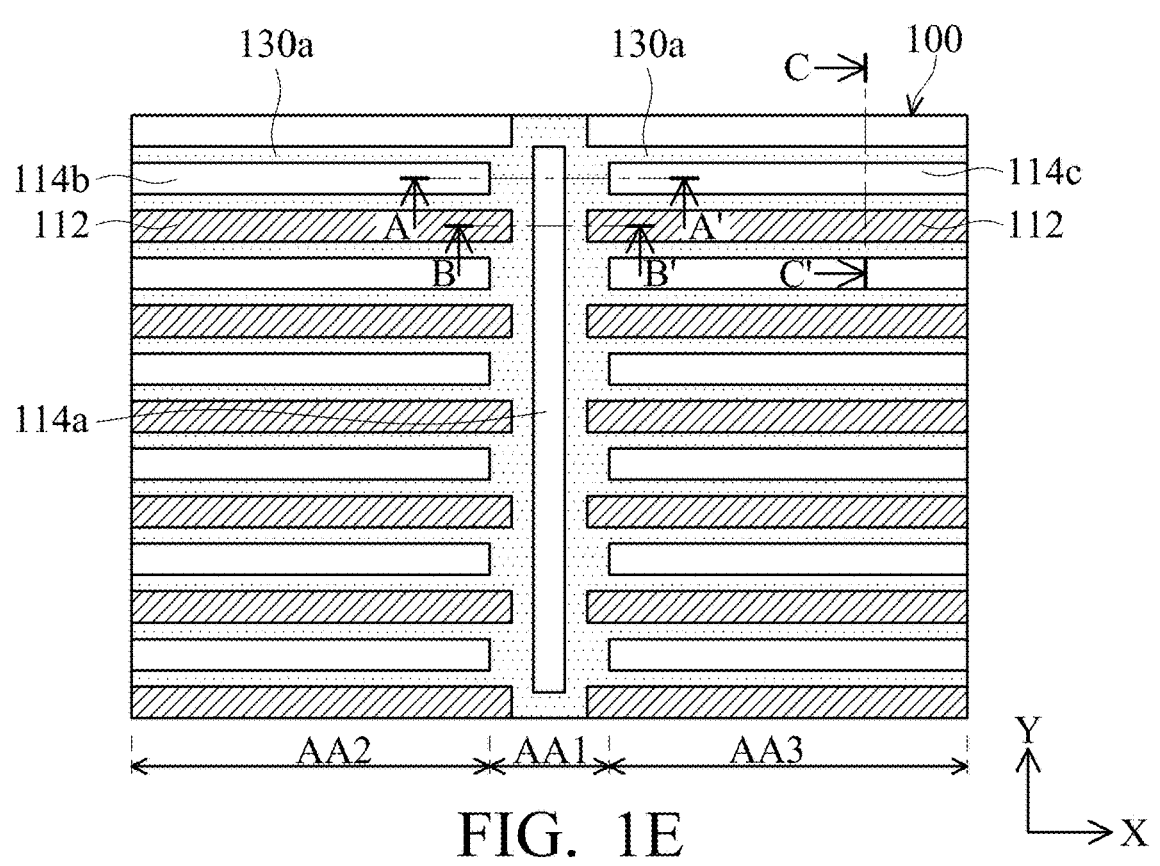

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed.

In some embodiments, a method of forming a semiconductor structure includes providing a semiconductor substrate 100 that includes a first active area AA1 between a second active area AA2 and a third active area AA3. Namely, the second active area AA2 and the third active area AA3 are respectively on opposite sides of the first active area AA1, as shown in FIGS. 1A, 2A, 3A and 4A. In some embodiments, the first active area AA1 overlaps the coverage area of the subsequent source line, and is therefore also referred to as a common source line region (which is sometimes referred to as a source rail region). The second active area AA2 and the third active area AA3 are also referred to as array active regions. In some embodiments, the semiconductor structure is an active area of a semiconductor device (e.g., a memory device).

The semiconductor substrate 100 may be a silicon semiconductor substrate, a silicon-on-insulator (SOI) semiconductor substrate, or another suitable semiconductor substrate (e.g., a gallium arsenide semiconductor substrate, a gallium nitride semiconductor substrate, or a silicon germanium semiconductor substrate). In some embodiments, the semiconductor substrate 100 is a silicon semiconductor substrate. Afterwards, a to-be-defined layer 110, a hard mask layer 112 (which is sometimes referred to as a first mask layer), a sacrificial material layer 114, and a multi-layer mask structure are successively formed over the semiconductor substrate 100 to cover the first active area AA1, the second active area AA2, and the third active area AA3 of the semiconductor substrate 100.

In some embodiments, the to-be-defined layer 110 may be a single-layer or multi-layer structure. For example, when the to-be-defined layer 110 is a single-layer structure, the material of the to-be-defined layer 110 may include a metal or other suitable conductive material. Alternatively, when the to-be-defined layer 110 is a multi-layer structure, the to-be-defined layer 110 may include a conductive layer and a dielectric layer. The material of the conductive layer may include metal, doped polycrystalline silicon or other suitable conductive materials. The material of the dielectric layer may include silicon oxide, silicon nitride, silicon nitride, low-k materials, or combinations thereof. For example, the to-be-defined layer 110 may include a silicon oxide layer and a polysilicon layer, a tetraethyl orthosilicate (TEOS) oxide layer, a silicon nitride layer, and a silicon oxide layer successively formed thereon. The to-be-defined layer 110 may be formed by a suitable deposition process (e.g., a chemical vapor deposition process, an atomic layer deposition process, a spin coating process, or a combination of these processes). Herein, in order to simplify the diagram, only a flat layer is depicted as the to-be-defined layer 110.

In some embodiments, the hard mask layer 112 may include polysilicon or other suitable cover material. Alternatively, the sacrificial material layer 114 may include carbon or other suitable material.

In some embodiments, the multi-layer mask structure includes an optional mask layer 116 and an overlying mask pattern layer 120 (which is also referred to as a second mask layer). In some embodiments, the hard mask layer 116 may be an anti-reflective layer and may include silicon nitride, silicon nitride oxide, or other suitable anti-reflective material. The hard mask layer 112, the sacrificial material layer 114, and the hard mask layer 116 may be formed by a suitable deposition process, such as a chemical vapor deposition process, an atomic layer deposition process, a spin coating process, or another suitable deposition process. Further, the mask pattern layer 120 may include photoresist material.

Figure 2A:
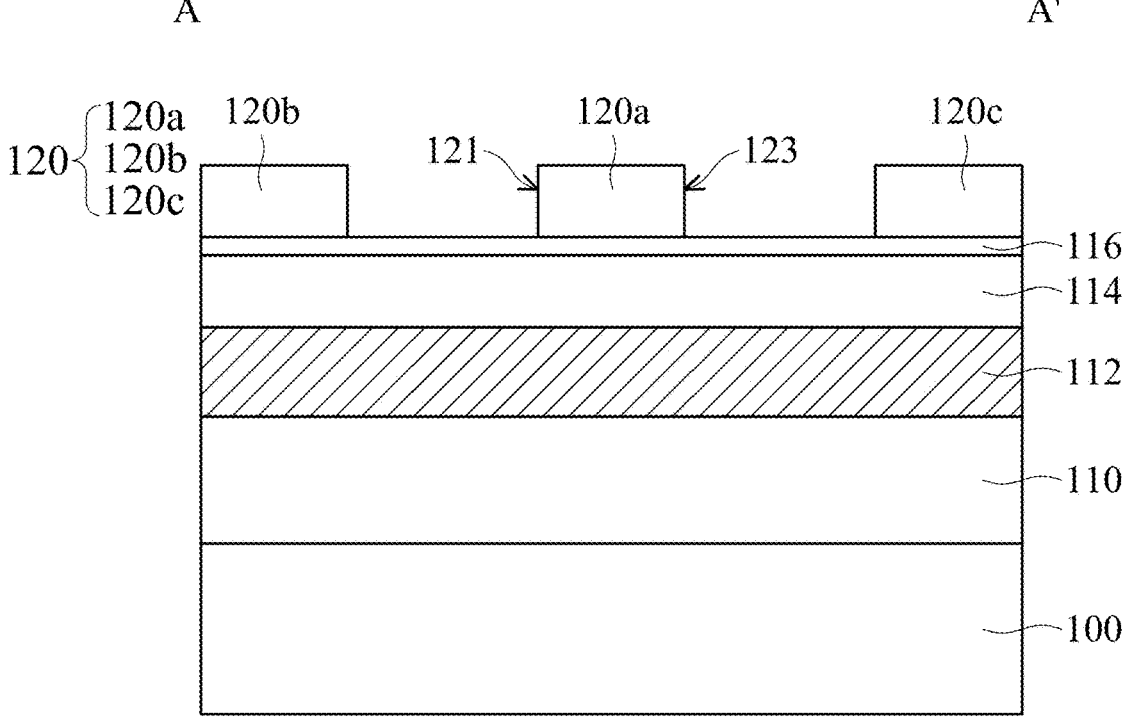
FIGS. 2A to 2I are cross-sectional views taken along the A-A' line in FIGS. 1A to 1I, respectively.
Figure 2B:
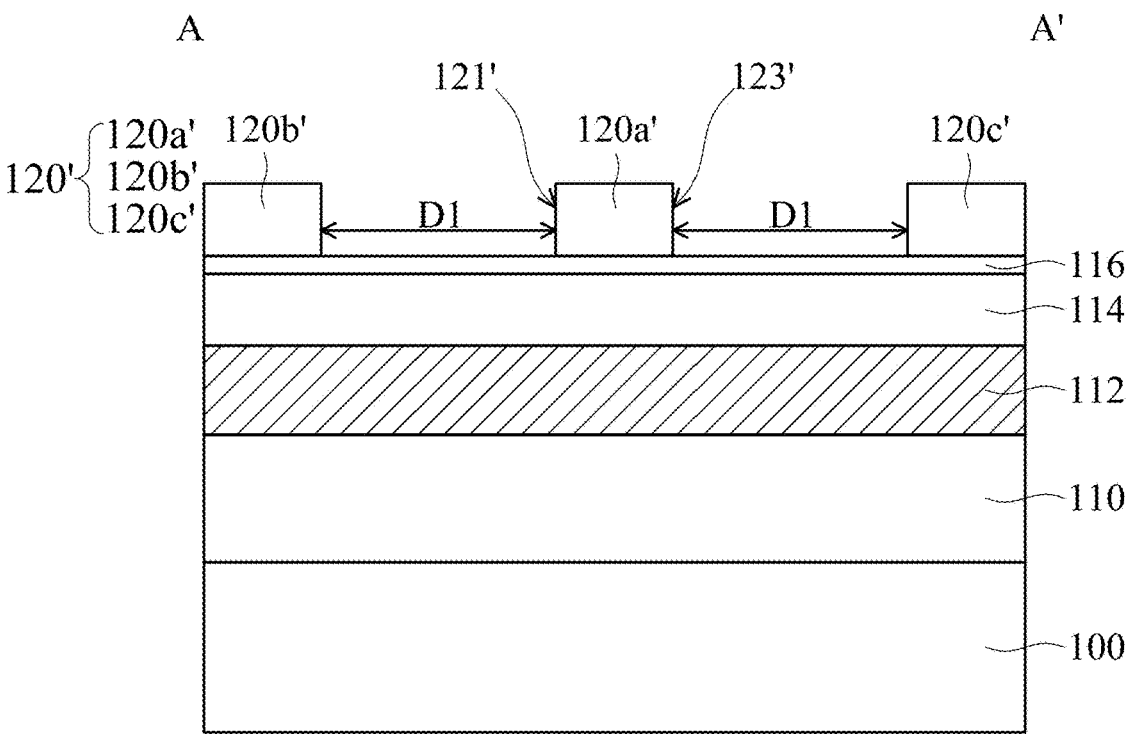
Figure 2C:
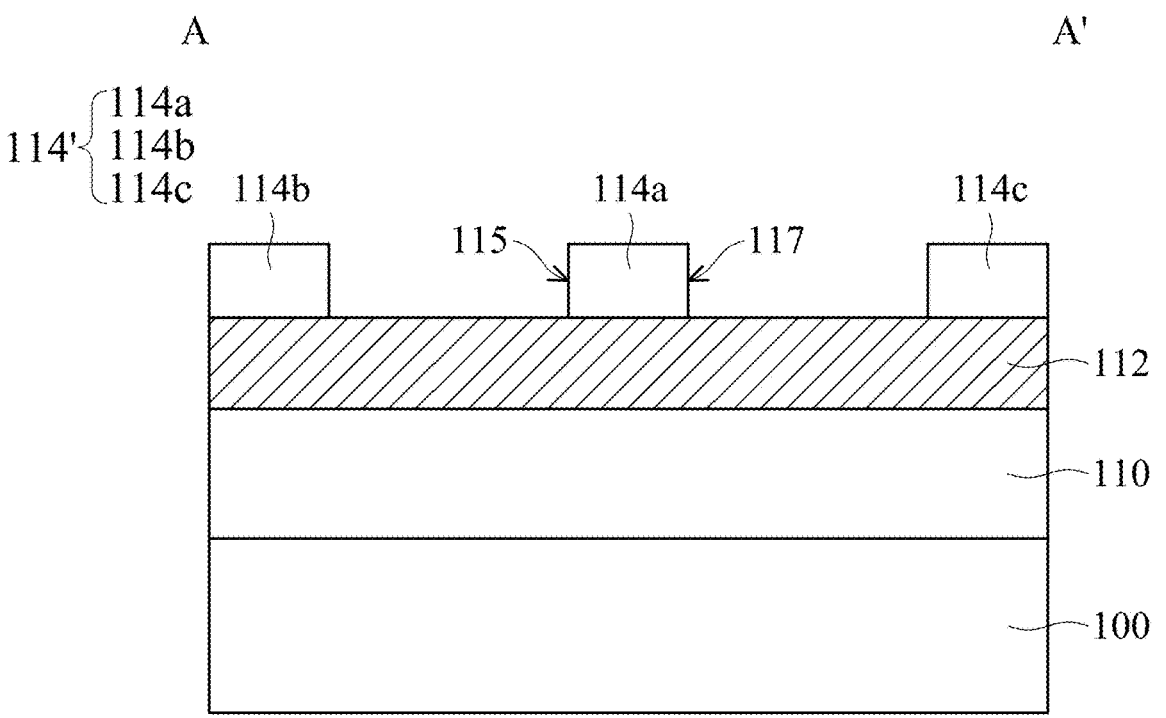

In some embodiments, the multi-layer mask structure serves as an etching mask for the subsequent etching processes, and a first pattern of the mask pattern layer 120 corresponds to the first active area AA1, the second active area AA2, and the third active area AA3 of the semiconductor substrate 100. More specifically, the first pattern includes a bar portion 120a, a first set of branch portions 120b, and a second set of branch portions 120c. The bar portion 120a corresponds to the first active area AA1 of the semiconductor substrate 100 and extends in a first direction (e.g., Y-direction). The first set of branch portions 120b and the second set of branch portions 120c correspond to the second active area AA2 and the third active area AA3 of the semiconductor substrate 100, respectively, and each extends in a second direction (e.g., the X direction) different than the first direction. In some embodiments, the first set of branch portions 120b and the second set of branch portions 120c are symmetrically arranged on two opposite sides of the bar portion 120a with respect to the bar portion 120a as a symmetrical axis. More specifically, as shown in FIGS. 1A and 2A, each branch portion of the first set of branch portions 120b is separated from the first sidewall 121 of the bar portion 120a by a distance. Similarly, each branch portion in the second set of branch portions 120c is separated from the second sidewall 123 of the bar portion 120a by the same distance as mentioned above. In some embodiments, the width of the bar portion 120a may be substantially the same as the width of each branch portion in the first set of branch portions 120b and the width of each branch portion in the second set of branch portions 120c. In some other embodiments, the width of the bar portion 120a may be greater than the width of any branch portion in the first set of branch portions 120b and the second set of branch portions 120c.

In some embodiments, the bar portion 120a is configured to define a common source line region of the memory device. The first set of branch portions 120b and the second set of branch portions 120c are configured to define the channel regions and the source/drain regions of the transistors in the memory device. In the embodiment, the bar portion 120a is a rectangular pattern, in which the short side of the bar portion 120a is parallel to the second direction, and the long side of the bar portion 120a is parallel to the first direction. Further, each branch portion in the first set of branch portions 120b and each branch portion in the second set of branch portions 120c are also rectangular patterns, in which the short side of each branch portion is parallel to the first direction, and the long side of each branch portion is parallel to the second direction.

Next, refer to FIGS. 1B, 2B, 3B, and 4B, in some embodiments, the mask pattern layer 120 can be optionally trimmed to reduce the line width of the first pattern, thereby forming a trimmed mask pattern layer 120'. The trimmed mask pattern layer 120' includes a trim bar portion 120a', a trimmed first set of branch portions 120b', and a trimmed second set of branch portions 120c' (which are collectively referred to as a trimmed pattern). The line widths of the trimmed bar portion 120a', the trimmed first set of branch portions 120b', and the trimmed second set of branch portions 120c' are less than the line widths of the bar portion 120a, the first set of branch portions 120b, and the second set of branch portions 120c, respectively. Additionally, each trimmed branch portion in the trimmed first set of branch portions 120b' is separated from the first sidewall 121' of the trimmed bar portion 120a' by a distance D1. Similarly, each trimmed branch portion in the second set of branch portions 120c' is also separated from the second sidewall 123' of the trimmed bar portion 120a by the same distance of D1.

Next, refer to FIGS. 1C, 2C, 3C and 4C, in some embodiments, the trimmed pattern of the trimmed mask pattern layer 120' is transferred into the hard mask layer 116 and the underlying sacrificial material layer 114, thereby forming a sacrificial material pattern layer 114'. Afterwards, the upper surface of the hard mask layer 112 is partially exposed by successively removing the trimmed mask pattern layer 120' and the hard mask layer 116 above the sacrificial material pattern layer 114'. As a result, the sacrificial material pattern layer 114' also has a second pattern on the semiconductor substrate 100 corresponding to the first pattern (as shown in FIG. 1A) or the trimmed mask pattern layer 120' (as shown in FIG. 1B). More specifically, the second pattern includes a bar portion 114a, a first set of branch portions 114b and a second set of branch portions 114c. Further, the bar portion 114a, the first set of branch portions 114b and the second set of branch portions 114c correspond to the trimmed bar portion 120a', the trimmed first set of branch portions 120b' and the trimmed second set of branch portions 120c', respectively. The line widths of the bar portion 114a, the first set of branch portions 114b and the second set of branch portions 114c are substantially equal to the line widths of bar portion 120a', the trimmed first set of branch portions 120b' and the trimmed second set of branch portions 120c', respectively. Additionally, each branch portion in the first set of branch portions 114b is separated from the first sidewall 115 of the bar portion 120a by a distance that is substantially equal to the distance D1. Similarly, each branch portion in the second set of branch portions 114c is separated from the second sidewall 117 of the bar portion 120a by the same distance (i.e., distance D1). The sacrificial material pattern layer 114' (which is sometimes also referred to as the sacrificial mandrel) may be formed by a suitable etching process (e.g., dry etching, wet etching, or a combination thereof).

Figure 2D:
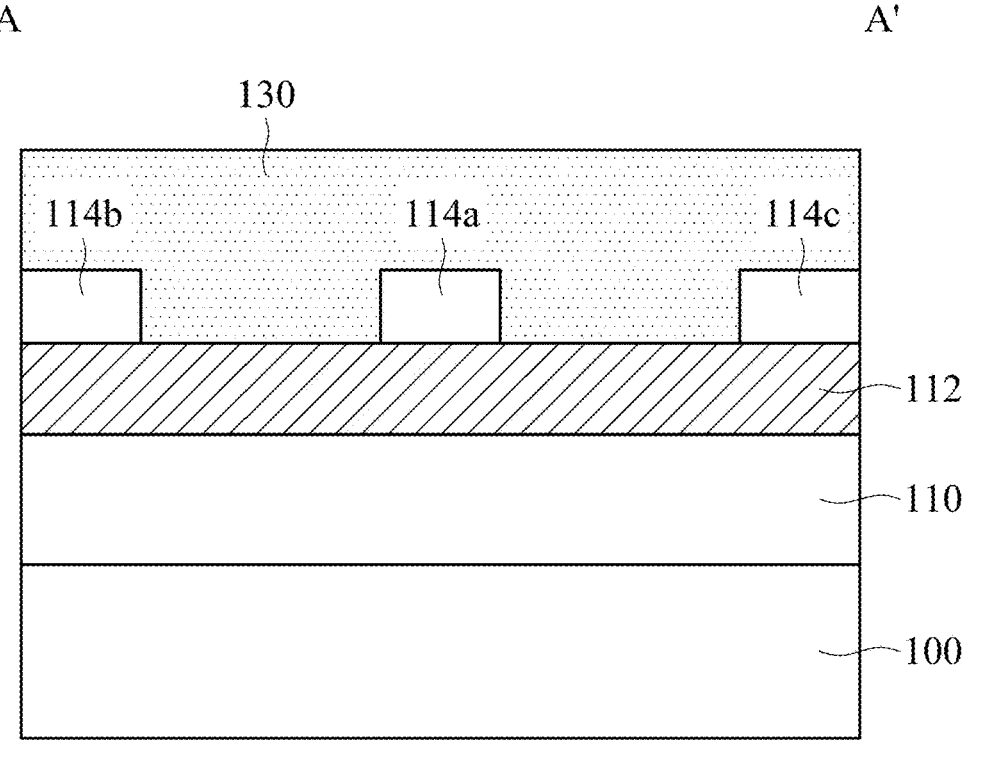
Figure 2E:
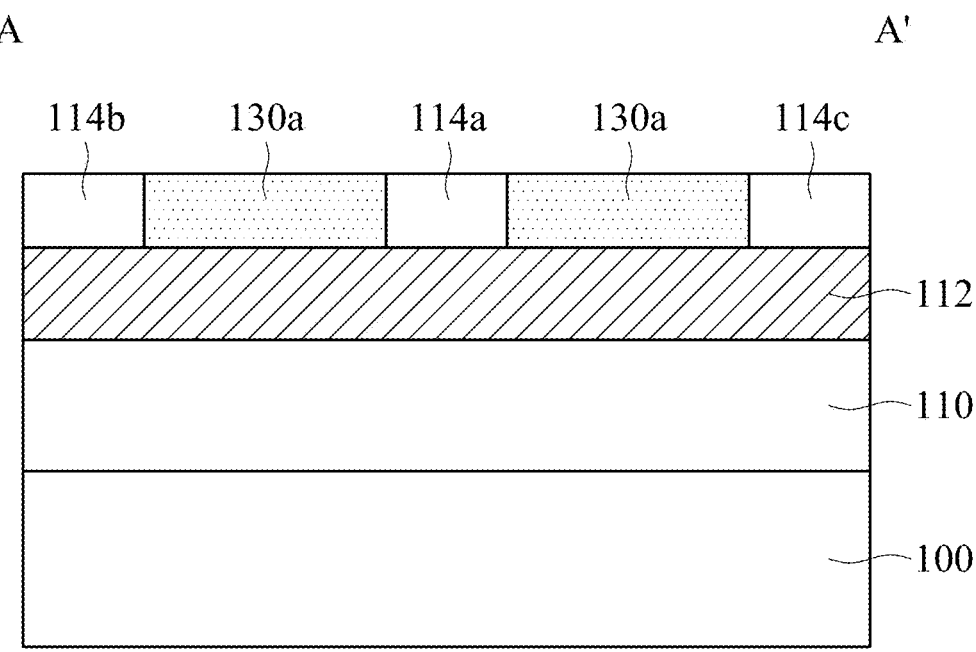
Figure 3A:
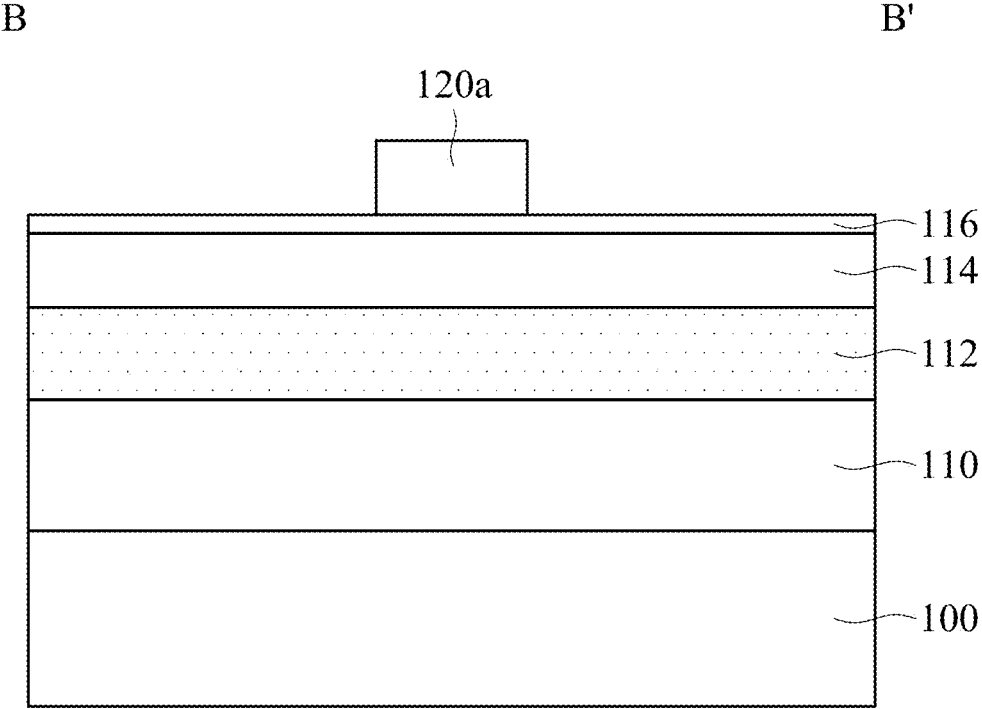
FIGS. 3A to 3I are cross-sectional views taken along the B-B' line in FIGS. 1A to 1I, respectively.
Figure 3B:
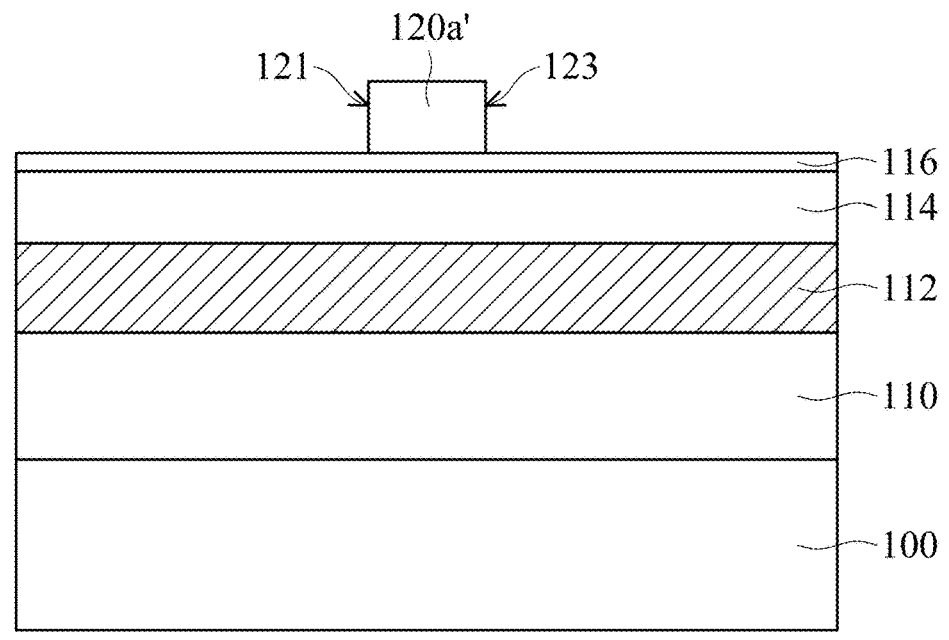
Figure 3C:
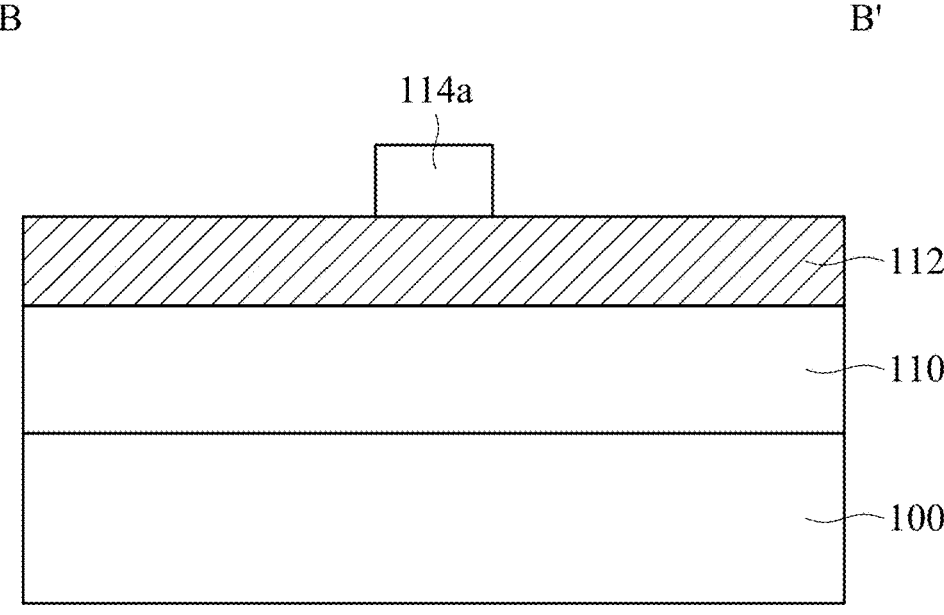
Figure 3D:
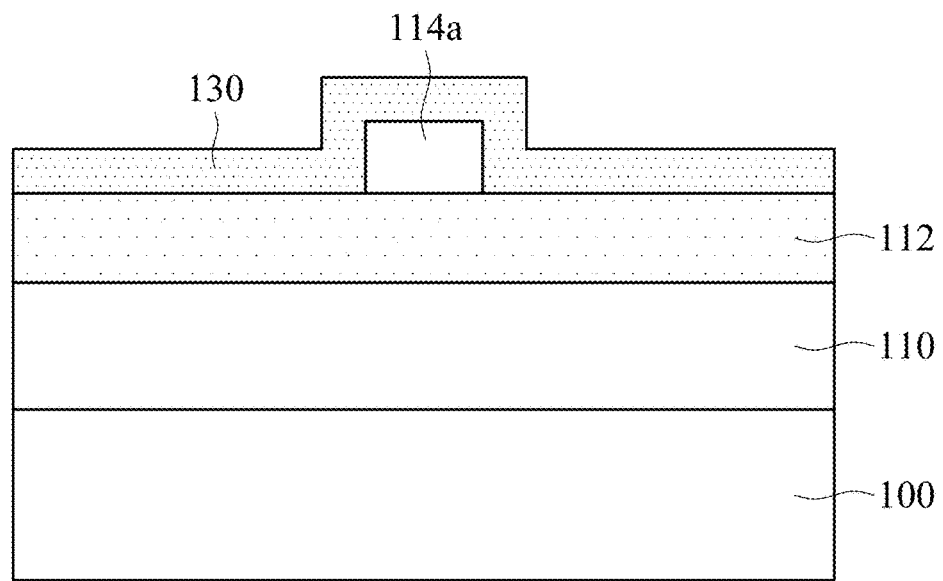
Figure 3E:
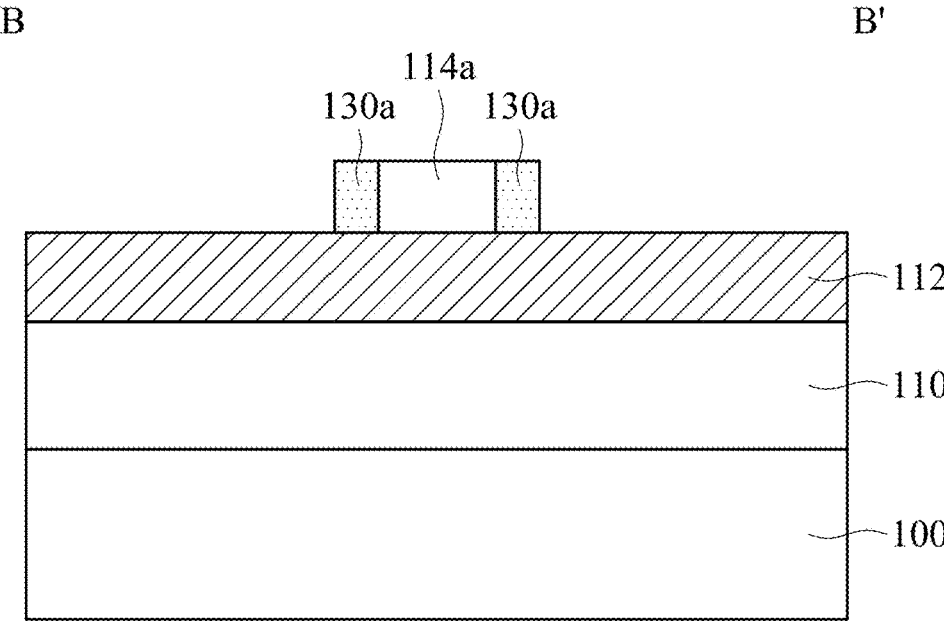
Figure 4A:
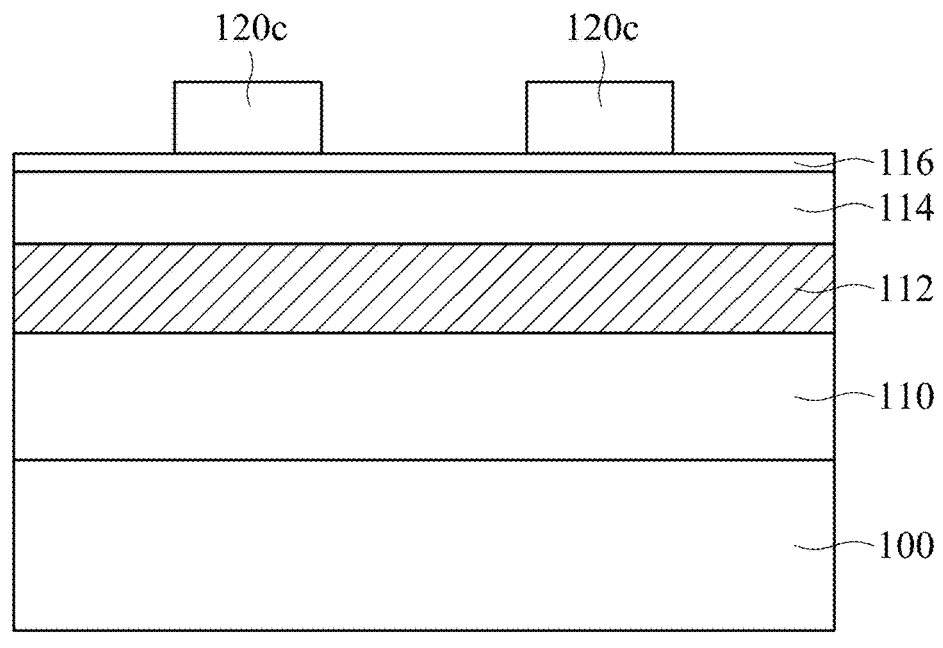
FIGS. 4A to 4I are cross-sectional views taken along the C-C' line in FIGS. 1A to 1I, respectively.
Figure 4B:
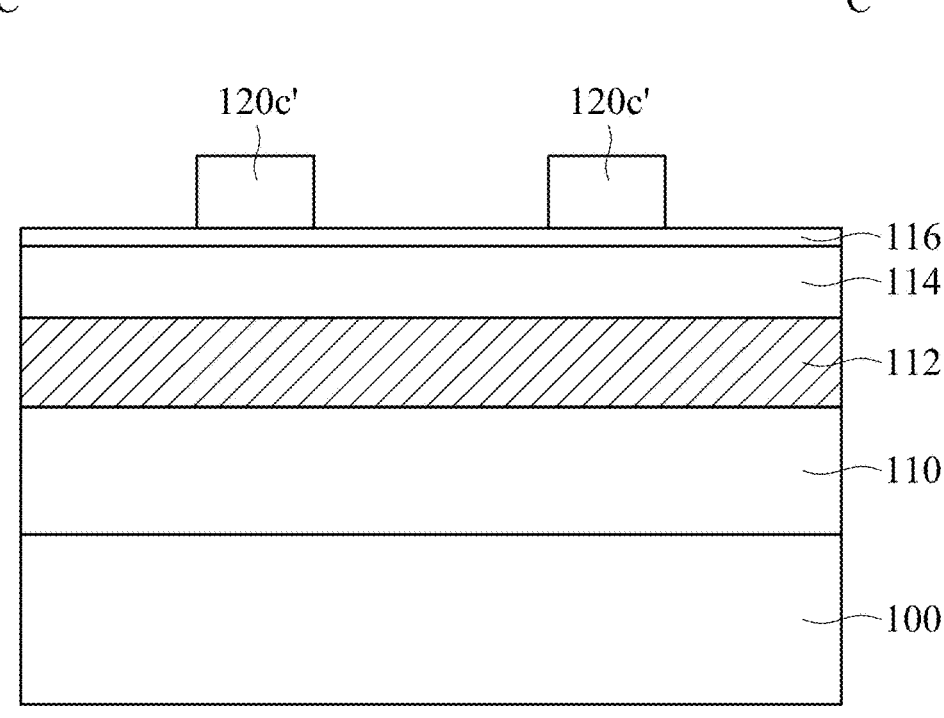
Figure 4C:
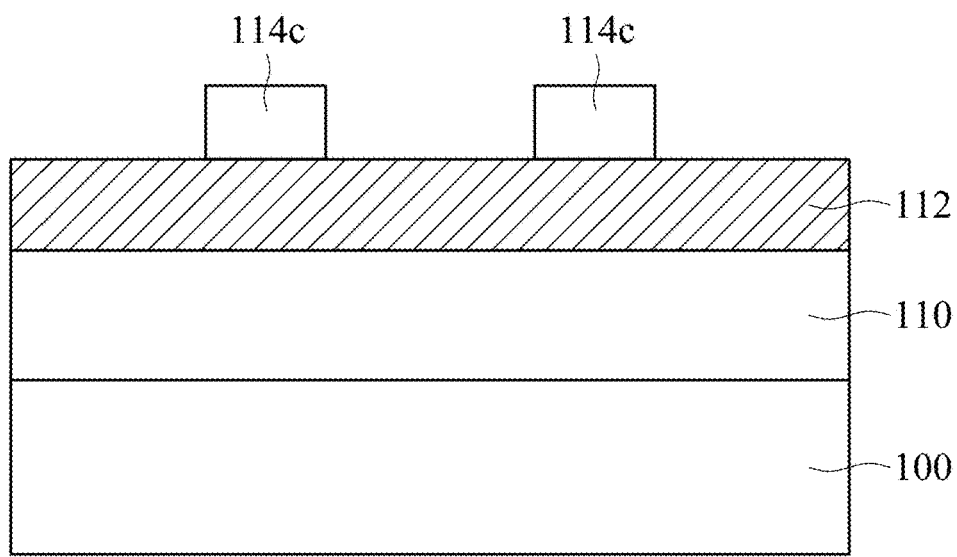
Figure 4D:
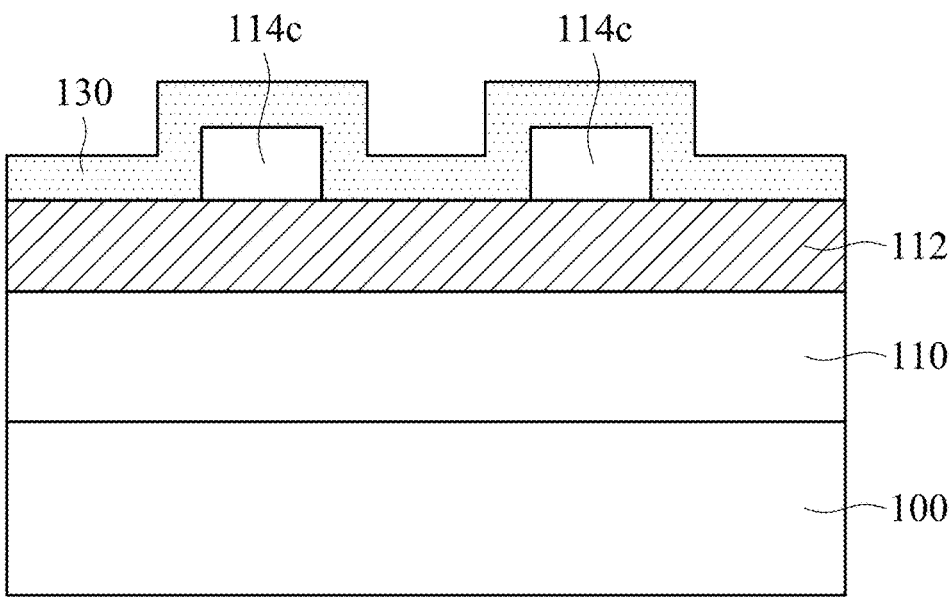
Figure 4E:
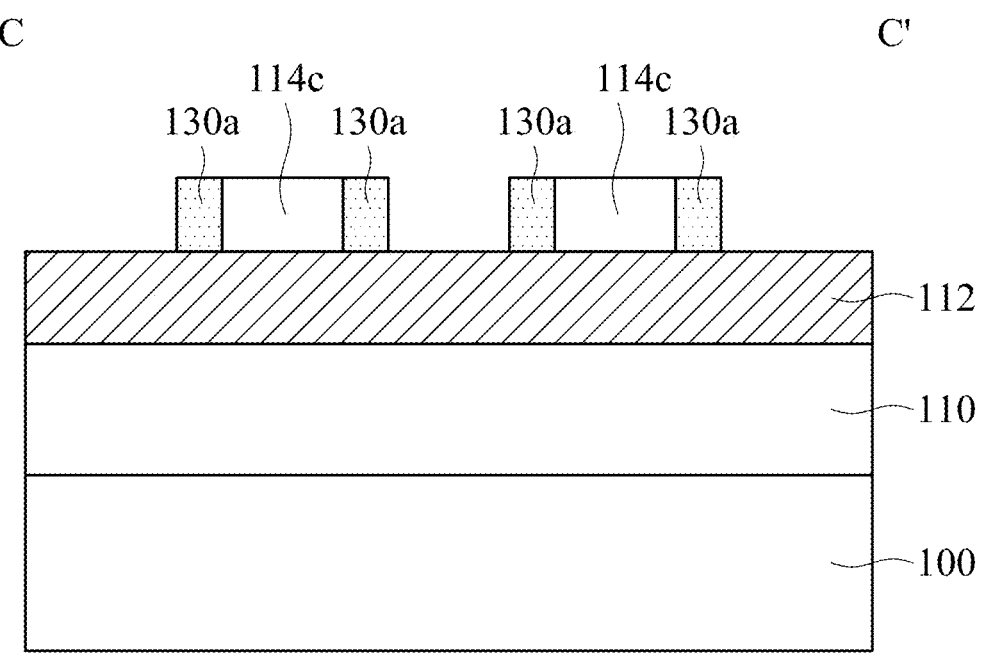
Figure 4F:
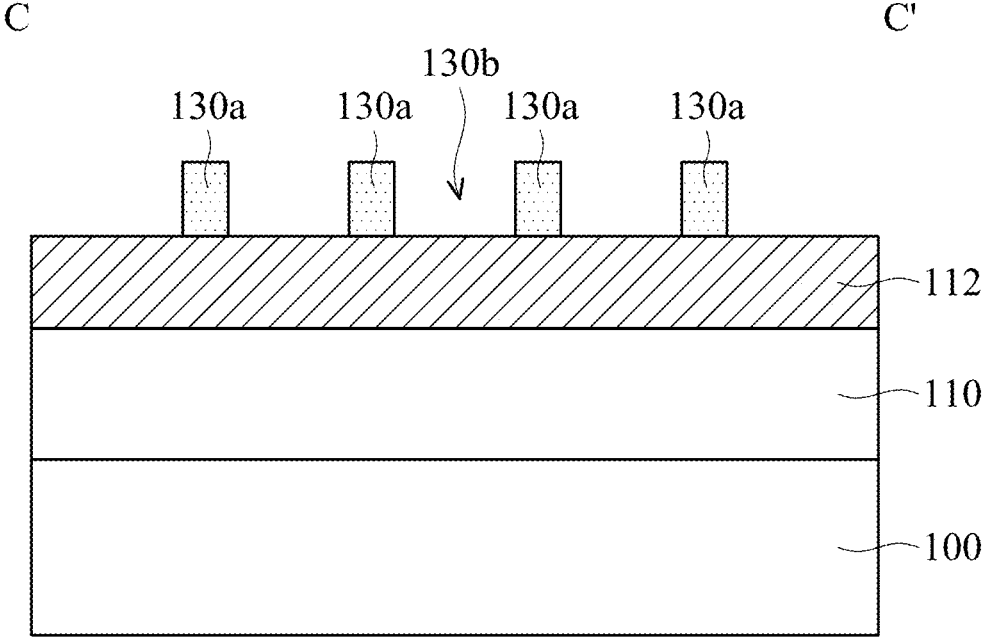
Figure 4G:
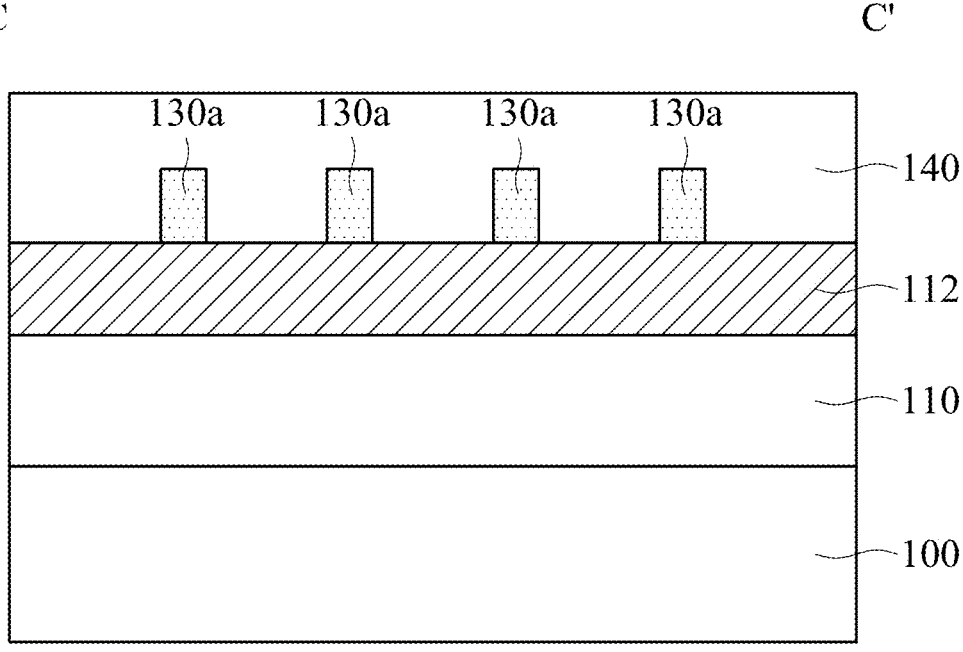
Figure 4H:
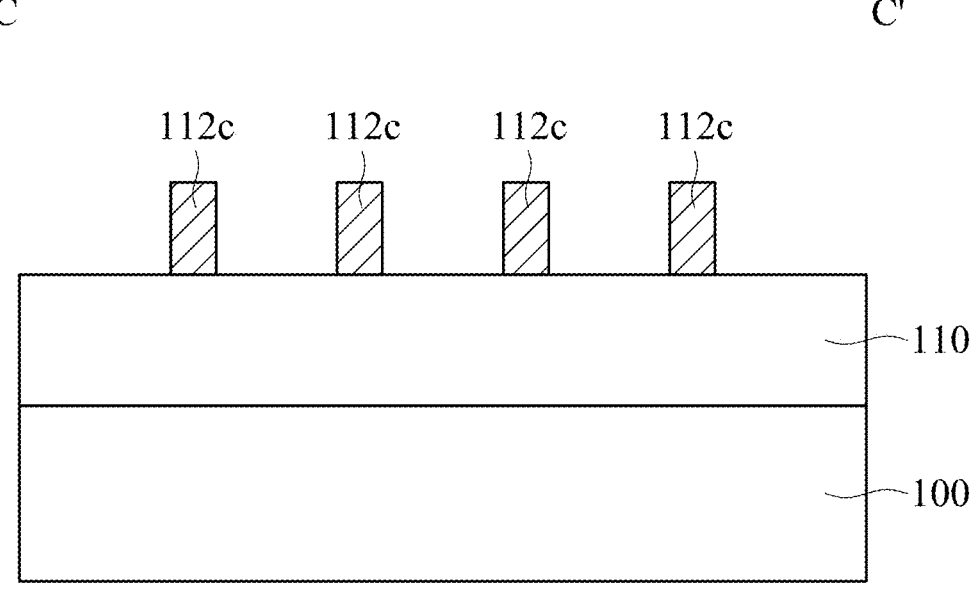
Figure 4I:
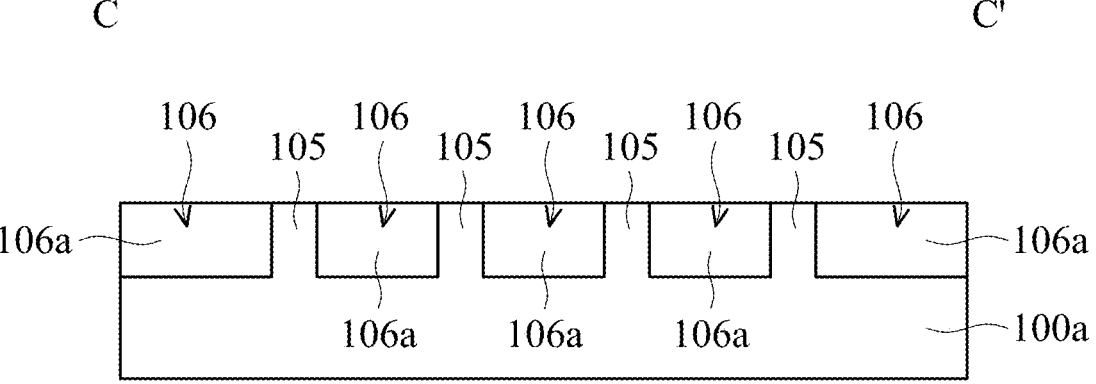

Next, refer to FIGS. 1D, 2D, 3D, and 4D, in some embodiments, a spacer material liner 130 is formed over the sacrificial material pattern layer 114' and the hard mask layer 112, in which the spacer material liner 130 conformally covers the sacrificial material pattern layer 114' (as shown in FIGS. 3D and 4D). However, the distance D1 between each branch portion in the first set of branch portions 114b (or second set of branch portions 114c) and the bar portion 114a is less than the distance between two adjacent branch portions in the first set of branch portions 114b (or second set of branch portions 114c). Therefore, the space between each branch portion in the first set of branch portions 114b (or second set of branch portions 114c) and the bar portion 114a (as shown in FIG. 2D) may be fully filled with the spacer material liner 130. In other words, the minimum thickness of the spacer material liner 130 formed between the bar portion 114a and each branch portion in the first set of branch portions 114b (or second set of branch portions 114c) (as shown in FIG. 2D) is greater than the minimum thickness of the spacer material liner 130 formed between the two adjacent branch portion in the first set of branch portions 114b (or second set of branch portions 114c) (as shown in FIG. 4D). In some embodiments, the material of the spacer material liner 130 includes silicon oxide or another suitable material. The spacer material liner 130 may be formed by a suitable deposition process, such as a chemical vapor phase deposition process, an atomic layer deposition process, a spin coating process, or another suitable deposition process.

Next, refer to FIGS. 1E, 2E, 3E, and 4E, in some embodiments, by etching the spacer material liner 130, spacer layers 130a are formed over the hard mask layer 112 exposed from the sacrificial material pattern layer 114'. For example, an anisotropic etching process (e.g., reactive ion etching (RIE) process) is performed in the spacer material liner 130, so that the spacer layers 130a are formed around the bar portion 114a, the first set of branch portions 114b, and the second set of branch portions 114c in the second pattern. The spacer layers 130a on the opposite sides of the bar portion 114a have toothed strips each extending in the second direction (e.g., the X direction) (or referred to as a comb-like structure).

Next, refer to FIGS. 1F, 2F, 3F, and 4F, in some embodiments, the sacrificial material pattern layer 114' is removed to leave the spacer layers 130a with an opening pattern 130b. Such a removal step may be performed by a suitable etching process (e.g., dry etching, wet etching, or a combination thereof).

Next, refer to FIGS. 1G, 2G, 3G, and 4G, in some embodiments, a mask structure 146 is formed on the spacer layers 130a and the hard mask layer 112. The mask structure 146 may be used as an etch mask for subsequently etching the hard mask layer 112. More specifically, the mask structure 146 may include a planarization layer 140 and a top pattern layer 142.

In some embodiments, the planarization layer 140 is configured to provide a substantially planar upper surface. More specifically, the planarization layer 140 may be a spin on carbon (SOC) layer or be made of another anti-reflective material. Further, the top pattern layer 142 has a bar pattern and is therefore also referred to as a bar mask layer, as shown

Figure 1F:
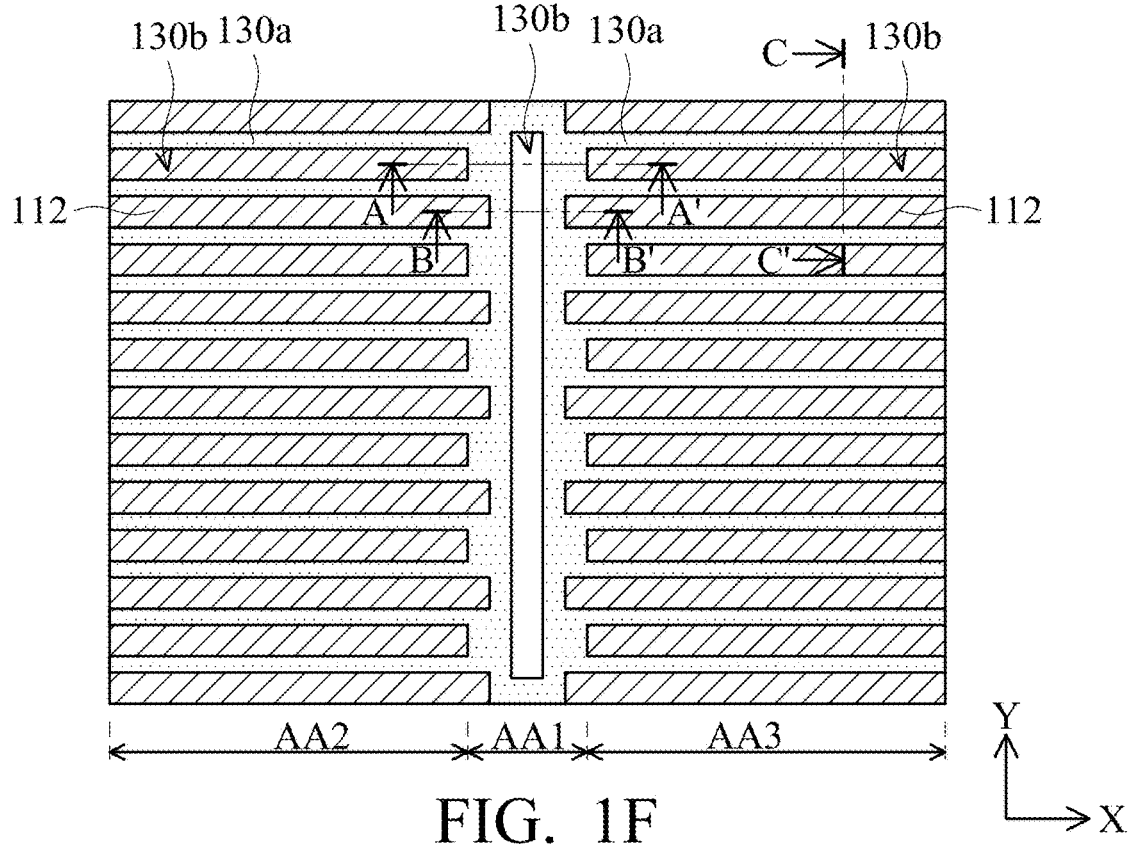
Figures 1G, 1H:
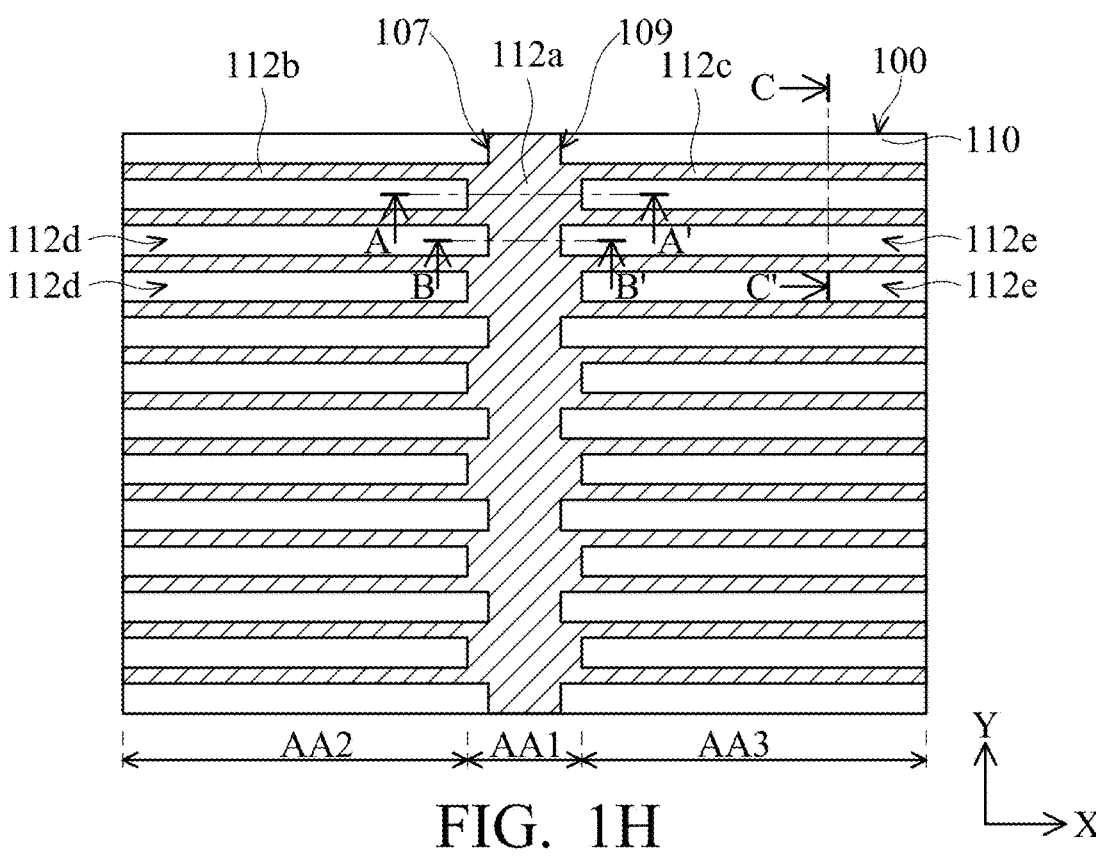

7 in FIG. 1G. The top pattern layer 142 corresponds to and covers the opening pattern 130*b* for defining a common source line pattern in the subsequent process. In some embodiments, the top pattern layer 142 may include a photoresist material.

Next, refer to FIGS. 1H, 2H, 3H, and 4H, in some embodiments, the hard mask layer 112 is etched to expose the upper surface of the lower to-be-defined layer 110 using the remaining spacer layers 130*a* and the mask structure 146 as an etch mask (which is also referred to as a combined etch mask), thereby forming a patterned hard mask layer 112. Such an etching process may include a dry etching process, a wet etching process, or a combination thereof. After the etching process, the remaining planarization layer 140 and the remaining top pattern layer 142 are removed.

The patterned hard mask layer 112 includes a third pattern. Specifically, the third pattern includes a bar portion 112*a*, a first set of branch portions 112*b*, and a second set of branch portions 112*c*. Also, the third pattern has a first set of openings 112*d* and a second set of openings 112*e*. The bar portion 112*a* corresponds to the first active area AA1 and extends in the first direction.

Further, the first set of branch portions 112*b* and the second set of branch portions 112*c* correspond to the second active area AA2 and the third active area AA3 of the semiconductor substrate 100, respectively, and extend in the second direction. That is, one end of the first set of branch portions 112*b* and one end of the second set of branch portions 112*c* are connected to the bar portion 112*a*. In some embodiments, the first set of branch portions 112*b* and the second set of branch portions 112*c* are symmetrically arranged on two opposite sides of the bar portion 112*a* with the bar portion 112*a* as a symmetrical axis.

Alternatively, the first set of openings 112*d* is formed in the second active area AA2 and is alternately arranged with the first set of branch portions 112*b* in the first direction. The second set of openings 112*e* is formed in the third active area AA3 and is alternately arranged with the second set of branch portions 112*c* in the first direction. In some embodiments, the two adjacent openings in the first set of openings 112*d* have different lengths, and the two adjacent openings in the second set of openings 112*e* have different lengths, as shown in FIG. 1H. Further, the first set of openings 112*d* and the second set of openings 112*e* are symmetrically arranged on two opposite sides of the bar portion 112*a* with the bar portion 112*a* as a symmetrical axis.

Next, refer to FIGS. 1I, 2I, 3I and 4I, in some embodiments, the third pattern of the patterned hard mask layer 112 is transferred into the to-be-defined layer 110. More specifically, the to-be-defined layer 110 and the underlying semiconductor substrate 100 are successively etched using the patterned hard mask layer 112 as an etch mask, to successively transfer the third pattern into the to-be-defined layer 110 and the semiconductor substrate 100. Such an etching process may include a dry etching process, a wet etching process, or a combination thereof.

Next, the to-be-defined layer 110 is removed to expose the upper surface of the semiconductor substrate 100. More specifically, the patterned semiconductor substrate 100 includes a base portion 100*a*, a semiconductor bar portion 101, a first set of semiconductor branch portions 103, and a second set of semiconductor branch portions 105. Also, the patterned semiconductor substrate 100 has a first set of isolation openings 104 and a second set of isolation openings 106. The base portion 100*a* includes a first active area AA1, a second active area AA2 and a third active area AA3. The semiconductor bar portion 101 corresponds to the bar portion 112*a* in the third pattern, so as to correspond to the first active area AA1 of the base portion 100*a* and extends in the first direction. The semiconductor bar portion 101 may serve as a common source line region of the memory device.

Figure 1I:
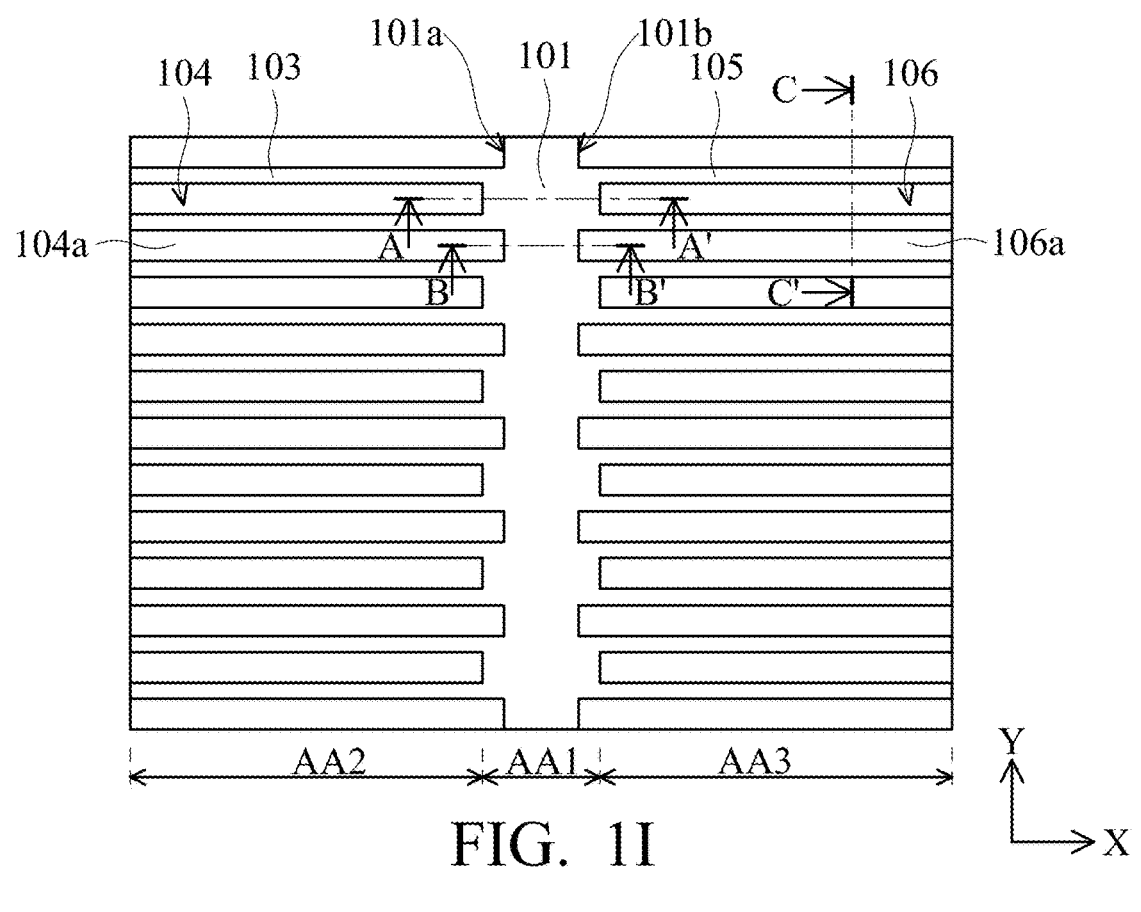

Further, the first set of semiconductor branch portions 103 and the second set of semiconductor branch portions 105 correspond to the first set of branch portions 112*b* and the second set of branch portions 112*c* in the third pattern, respectively, so that the first set of semiconductor branch portions 103 and the second set of semiconductor branch portions 105 correspond to the second active area AA2 and the third active area AA3 of the semiconductor substrate 100, respectively, and extend in the in the second direction. Each semiconductor branch portion in the first set of semiconductor branch portions 103 extends from the first sidewall 101*a* of the semiconductor bar portion 101 over the base portion 100*a* corresponding to the second active area AA2. Each semiconductor branch portion in the second set of semiconductor branch portions 105 extends from the second sidewall 101*b* of the semiconductor bar portion 101 over the base portion 100*a* corresponding to the third active area AA3 (as shown in FIG. 1I). In some embodiments, the first set of semiconductor branch portions 103 and the second set of semiconductor branch portions 105 are symmetrically arranged on two opposite sides of the semiconductor bar portion 101 with the semiconductor bar portion 101 as a symmetrical axis. In some embodiments, each semiconductor branch portion in the first set of semiconductor branch portions 103 and the second set of semiconductor branch portions 105 serves as a channel region and source/drain regions of a transistor in the memory device.

Additionally, the first set of isolation openings 104 corresponds to the first set of openings 112*d* of the third pattern, and the first set of isolation openings 104 and the first set of semiconductor branch portions 103 are alternately arranged along the first direction. Similarly, the second set of isolation openings 106 corresponds to the second set of openings 112*c* of the third pattern, and the second set of isolation openings 106 and the second set of semiconductor branch portions 105 are alternately arranged along the first direction. In some embodiments, in the first set of isolation openings 104, the two adjacent isolation openings have different lengths. Similarly, in the second set of isolation openings 106, the two adjacent isolation openings have different lengths. Further, the first set of isolation openings 104 and the second set of isolation openings 106 are symmetrically arranged on opposite sides of the semiconductor bar portion 101 with the semiconductor bar portion 101 as a symmetrical axis.

In some embodiments, after removing the to-be-defined layer 110, an insulating material is filled into the first set of isolation openings 104 and the second set of isolation openings 106 to form the first set of isolation structures 104*a* and the second set of isolation structures 106*a*, respectively. The first set of isolation structures 104*a* and the second set of isolation structures 106*a* may also be referred to as shallow trench isolation structures. In some embodiments, the first set of isolation structures 104*a* is employed to isolate two adjacent semiconductor branch portions in the first set of semiconductor branch portions 103, and the second set of isolation structures 106*a* is configured to isolate two adjacent semiconductor branch portions in the second set of semiconductor branch portions 105.

As shown in FIG. 1I, the semiconductor bar portion 101 in the semiconductor structure of this embodiment has different widths. The interface between each isolation structure in the first set of isolation structures 104*a* and the semiconductor bar portion is flat, and the interfaces between the two adjacent isolation structures and the semiconductor bar portion are staggered from each other along the extension direction of the semiconductor bar portion, respectively. In one embodiment, in the first set of isolation structures 104a, the two adjacent isolation structures have different lengths (e.g., a first length and a second length). In some embodiments, the first set of isolation structures 104a is formed by alternately arranging isolation structures with the first length and isolation structures with second length. Similarly, the two adjacent isolation structures in the second set of isolation structures 106a also have different lengths (e.g., the first length and the second length). Further, the second set of isolation structures 106a is formed by alternately arranging isolation structures with the first length and isolation structures with second length.

Figures 1, 1I:
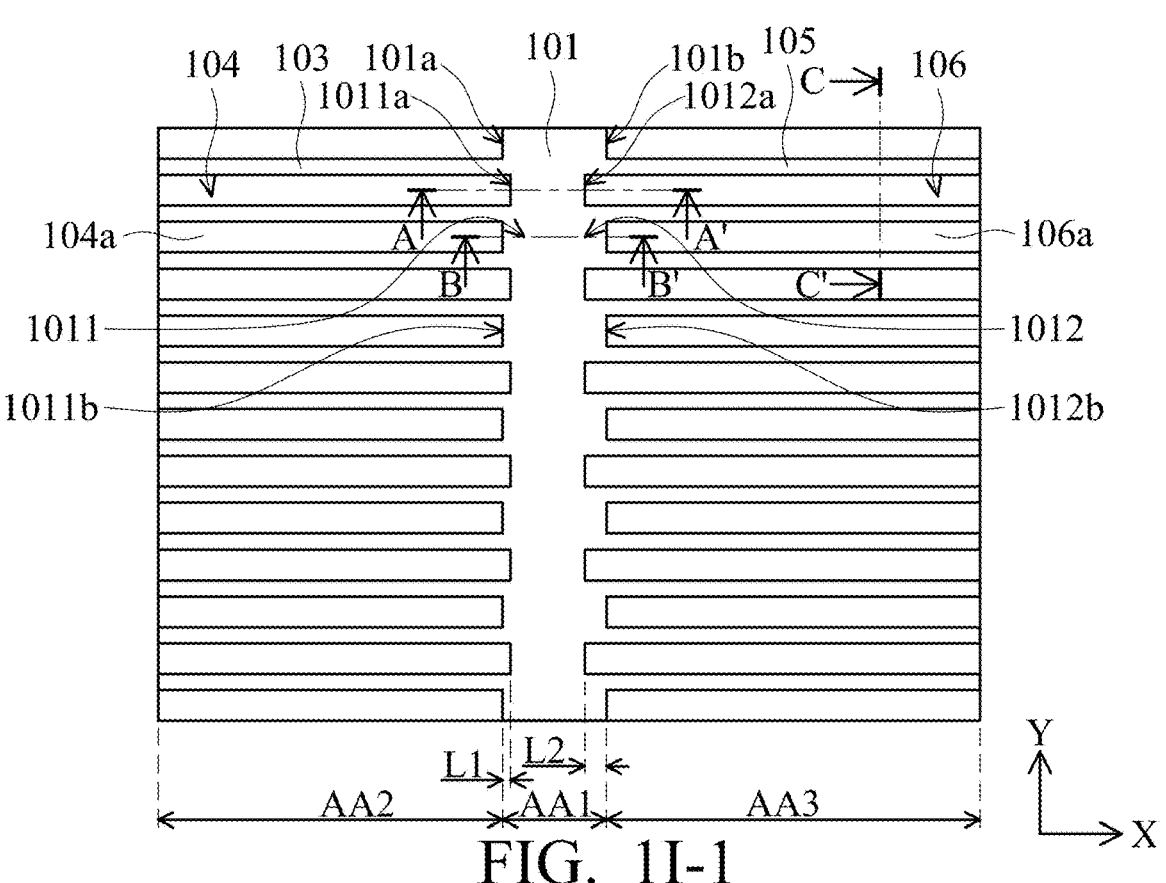
Figure 2F:
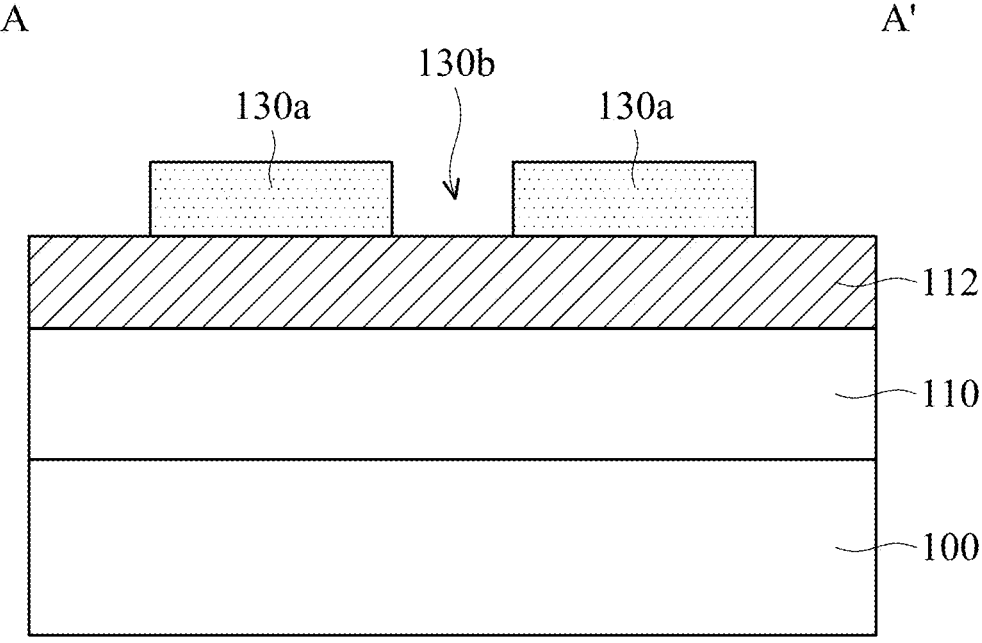
Figure 2G:
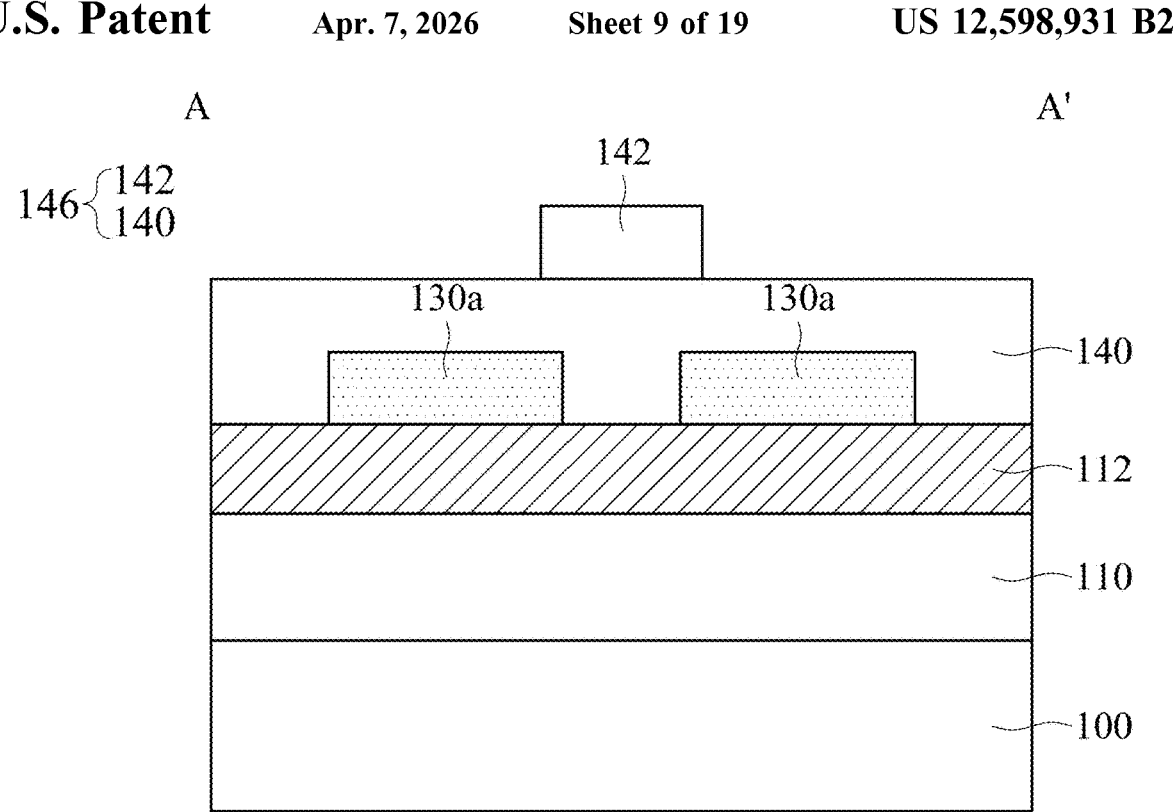
Figure 2H:
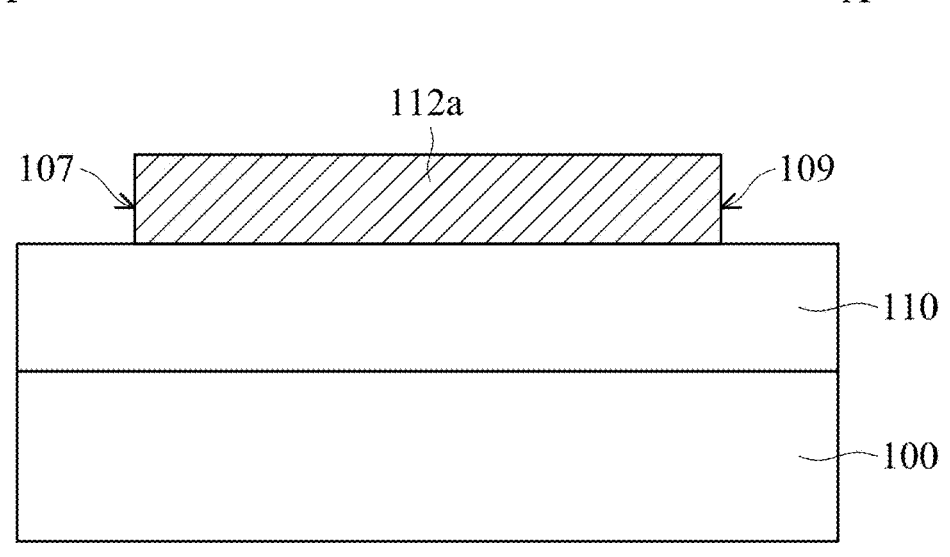
Figure 2I:
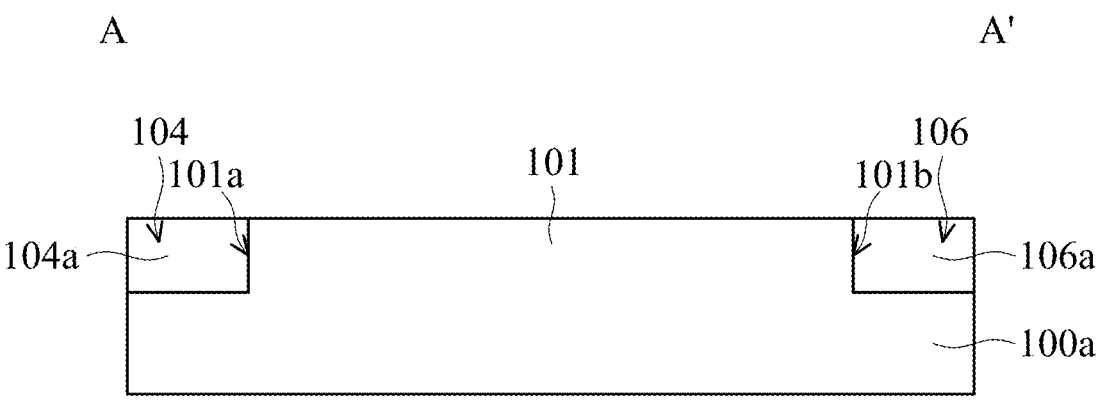
Figure 3F:
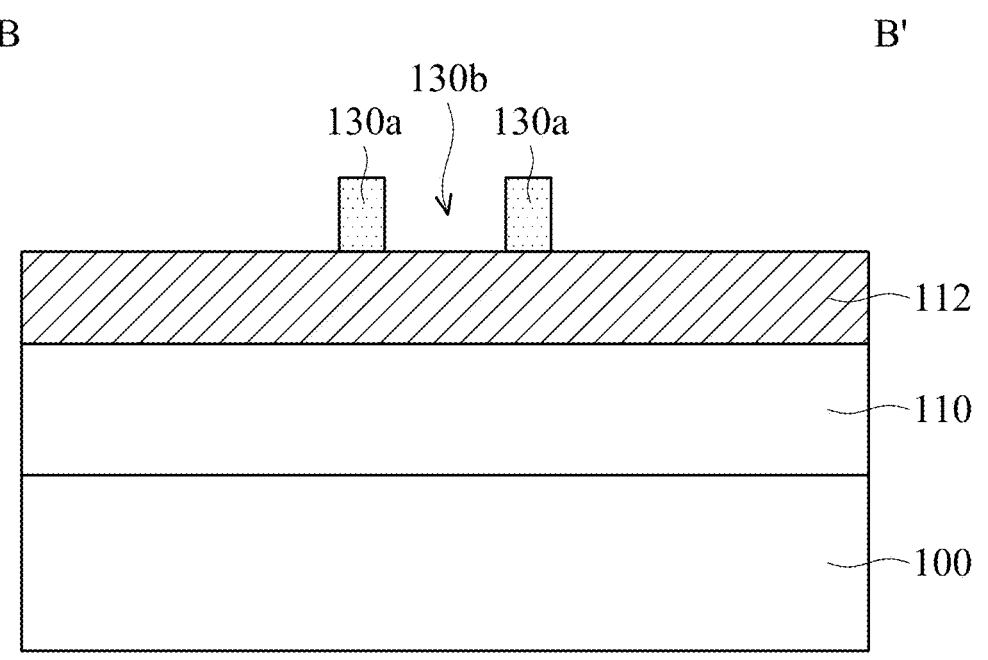
Figure 3G:
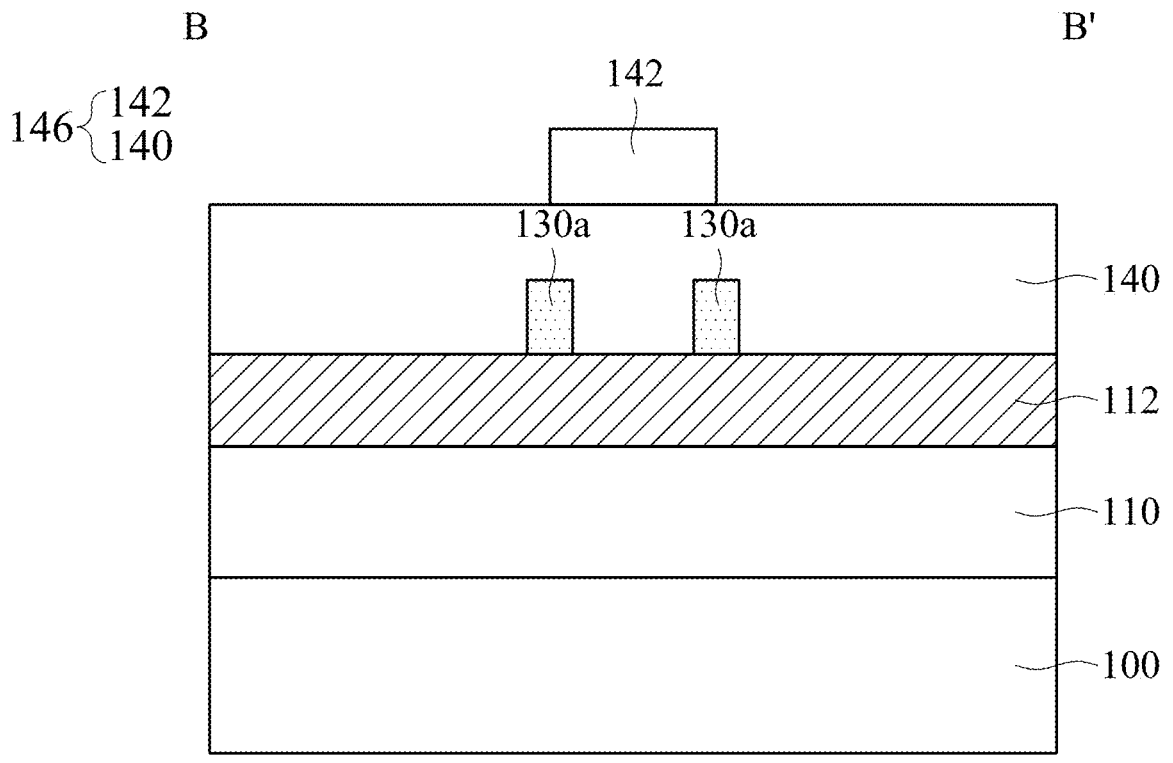
Figure 3H:
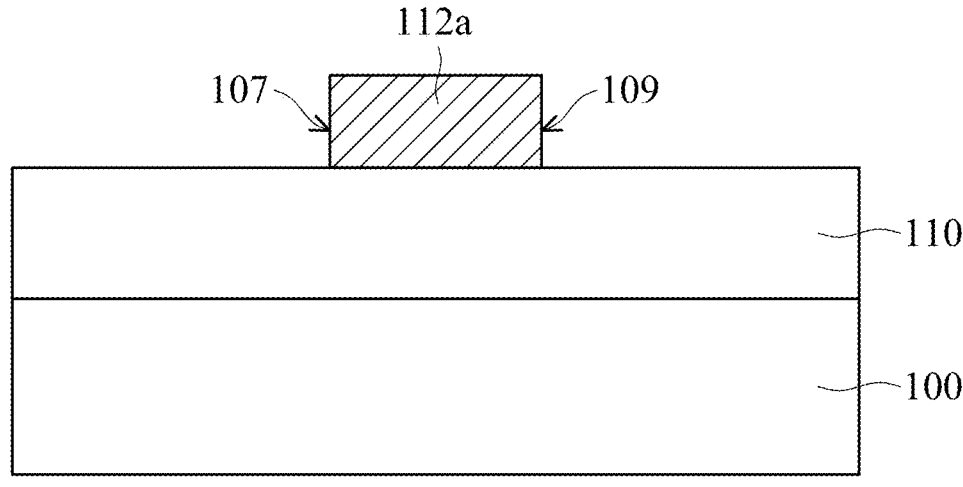
Figure 3I:
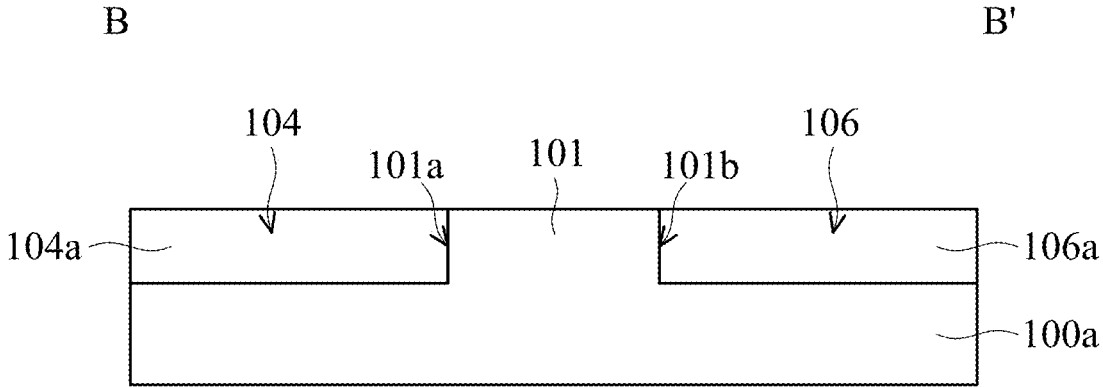

Refer to FIG. 1I-1, which illustrates a top view of a semiconductor structure according to another embodiment of the present disclosure, in which elements in FIG. 1I-1 that are the same as those in FIG. 1I are labeled with the same reference numbers as in FIG. 1I and are not described again for brevity. The semiconductor structure in FIG. 1I-1 has a semiconductor structure similar to the semiconductor structure in FIG. 1I and can be formed by the same or similar methods as described in FIGS. 1A to 1I. For example, refer to FIG. 1G, the semiconductor structure shown in FIG. 1I-1 is formed by having an overlay shift between the top pattern layer (bar mask layer) 142 and the bar opening 130b (as shown in FIGS. 1F, 2F, and 3F). Therefore, unlike FIG. 1I, in the semiconductor structure shown in FIG. 1I-1, the first set of isolation structures 104a and the second set of isolation structures 106a are asymmetrically arranged on two opposite sides of the semiconductor bar portion 101. Nevertheless, the interface between the semiconductor bar portion 101 and each isolation structure in the first set of isolation structures 104a and in the second set of isolation structures 106a is flat. The interfaces between the two adjacent isolation structures and the semiconductor bar portion 101 are staggered from each other along the extension direction of the semiconductor bar portion. In details, in the embodiment, the semiconductor bar portion 101 has a first extending portion 1011 and a second extending portion 1012. The first extending portion 1011 extends a first protruding length L1 from the extending plane of the first interface 1011a to the second interface 1011b. The second extending portion 1012 extends a second protruding length L2 from the extending plane of the third interface 1012a to the fourth interface 1012b. The first protruding length L1 is different from the second protruding length L2.

Further, in the embodiment, the difference in the lengths of the two adjacent isolation structures in the first set of isolation structures 104a is different from the difference in the lengths of the two adjacent isolation structures in the second set of isolation structures 106a.

According to the foregoing embodiments, in the mask pattern layer, the distance between each branch portion in the first set of branch portions (second set of branch portions) and the bar portion is less than the distance between two adjacent branch portions of the first set of branch portions (second set of branch portions). Therefore, semiconductor bar portions having different widths can be formed after subsequently patterning the semiconductor substrate. As a result, the interfaces between the semiconductor bar portion and the adjacent isolation structures are staggered from each other and the interfaces between the isolation structures and the semiconductor bar portion are flat, thereby eliminating or mitigating the necking phenomenon of the adjacent semiconductor branch portions during the SADP process. As a result, the CD variation and/or fracture of the semiconductor branch portions can be avoided, so that the memory device can have a stable operating current, and the yield and reliability of the memory device can be increased.

According to the above embodiment, although the overlay shift occurred during the SADP process, the interfaces between the adjacent isolation structures and the sidewall of the semiconductor bar portion can be staggered from each other, thus increasing the process window for etching the isolation openings, thereby reducing the manufacture cost.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a semiconductor substrate, comprising:
a base portion comprising a first active area and a second active area adjacent to the first active area;
a semiconductor bar portion located over the base portion corresponding to the first active area;
a first set of semiconductor branch portions comprising a plurality of first semiconductor branch portions extending from a first sidewall of the semiconductor bar portion onto the base portion corresponding to the second active area, and an extending direction of each of the first semiconductor branch portions different from an extending direction of the semiconductor bar portion; and
a first set of isolation structures comprising a first isolation structure and a second isolation structure, wherein the first set of isolation structures is formed over the base portion corresponding to the second active area, the first isolation structure and the second isolation structure are formed between different adjacent first semiconductor branch portions, and the first isolation structure and the second isolation structure are alternately arranged along the extending direction of the semiconductor bar portion;
wherein a first interface between the first isolation structure and the semiconductor bar portion and a second interface between the second isolation structure and the semiconductor bar portion are flat, and wherein the first interface and the second interface are staggered from each other along the extending direction of the semiconductor bar portion.

2. The semiconductor structure as claimed in claim 1, wherein the first isolation structure has a first length, and the second isolation structure has a second length that is different from the first length.

3. The semiconductor structure as claimed in claim 1, wherein the base portion further comprises a third active area adjacent to the first active area, and the first active area is between the second active area and the third active area, and wherein the semiconductor substrate further comprises:
a second set of semiconductor branch portions comprising a plurality of second semiconductor branch portions extending from a second sidewall of the semiconductor bar portion onto the base portion corresponding to the third active area, and an extending direction of each of the second semiconductor branch portions is different from the extending direction of the semiconductor bar portion; and a second set of isolation structures comprising a third isolation structure and a fourth isolation structure, wherein the second set of isolation structures is formed over the base portion corresponding to the third active area, the third isolation structure and the fourth isolation structure are formed between different adjacent second semiconductor branch portions, and the third isolation structure and the fourth isolation structure are alternately arranged along the extending direction of the semiconductor bar portion;

wherein a third interface between the third isolation structure and the semiconductor bar portion and a fourth interface between the fourth isolation structure and the semiconductor bar portion are flat, and wherein the third interface and the fourth interface are staggered from each other along the extending direction of the semiconductor bar portion.

4. The semiconductor structure as claimed in claim 3, wherein a length of the third isolation structure is different than a length of the fourth isolation structure.

5. The semiconductor structure as claimed in claim 3, wherein the first set of semiconductor branch portions and the second set of semiconductor branch portions are respectively arranged on two opposite sides of the semiconductor bar portion with the semiconductor bar portion as a symmetrical axis.

6. The semiconductor structure as claimed in claim 3, wherein the first set of isolation structures and the second set of isolation structures are respectively arranged on two opposite sides of the semiconductor bar portion with the semiconductor bar portion as a symmetrical axis.

7. The semiconductor structure as claimed in claim 3, wherein a difference between a length of the first isolation structure and a length of the second isolation structure is different than a difference between a length of the third isolation structure and a length of the fourth isolation structure.

8. The semiconductor structure as claimed in claim 3, wherein the semiconductor bar portion has a first extending portion and a second extending portion, the first extending portion extends a first protruding length from an extending plane of the first interface to the second interface, the second extending portion extends a second protruding length from an extending plane of the third interface to the fourth interface, and the first protruding length is different than the second protruding length.

* * * * *